US006496383B1

(12) United States Patent
Herrell et al.

(10) Patent No.: US 6,496,383 B1
(45) Date of Patent: Dec. 17, 2002

(54) INTEGRATED CIRCUIT CARRIER ARRANGEMENT FOR REDUCING NON-UNIFORMITY IN CURRENT FLOW THROUGH POWER PINS

(75) Inventors: Dennis J. Herrell, Marble Falls, TX (US); Thomas J. Hirsch, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 19 days.

(21) Appl. No.: 09/635,332

(22) Filed: Aug. 9, 2000

(51) Int. Cl.[7] ............................ H05K 7/10; H05K 7/08

(52) U.S. Cl. ....................... 361/780; 361/762; 361/794; 361/791; 257/697; 257/698; 174/250; 174/255; 174/262; 333/99 R; 333/17.2

(58) Field of Search ................................ 361/780, 762, 361/767, 776, 794, 791, 764, 718, 743, 692, 777; 257/780, 778, 737, 786, 713, 697, 698, 699, 728; 174/250, 262, 266, 255, 261; 333/99 R, 246, 247, 17.2

(56) References Cited

U.S. PATENT DOCUMENTS 4,223,179 A 9/1980 Lusk et al. ................ 174/73.1
4,316,159 A 2/1982 Ho ............................ 333/101
5,016,085 A * 5/1991 Hubbard et al. .............. 357/74
5,250,844 A 10/1993 Smith ........................ 257/695
5,520,683 A 5/1996 Subramaniam et al. ....... 606/32
5,523,921 A * 6/1996 Van Lydegraf ............. 361/792
5,682,297 A * 10/1997 Silva ......................... 361/777
5,682,298 A 10/1997 Raynham .................... 361/794
5,712,768 A * 1/1998 Werther ...................... 361/767
5,982,632 A * 11/1999 Mosley et al. .............. 361/775
6,011,695 A * 1/2000 Dumke ....................... 361/777
6,198,362 B1 * 3/2001 Harada et al. ................ 333/12

OTHER PUBLICATIONS

Herrell, Dennis J., "Power to the Package," *IEEE Spectrum,* Jul. 1999, 9 pp.

U.S. Patent Application entitled "Arrangement for Reducing Non–Uniformity in Current Flow Through Various Power Pins Within a Printed Wiring Board Connector for a Removable Module," filed Aug. 9, 2000, Attorney Docket No. 1001–0085, naming inventors Dennis J. Herrell and Thomas P. Dolbear, which is assigned to the assignee of the present invention, 47 pp.

* cited by examiner

*Primary Examiner*—David Martin
*Assistant Examiner*—Hung Bui
(74) *Attorney, Agent, or Firm*—Zagorin, O'Brien & Graham, LLP

(57) ABSTRACT

In an integrated circuit carrier having a large number of power pins allocated to an internal power plane, the current flowing through the power pins may divide very unevenly, and result in current flow through some of the power pins which exceeds the maximum specification for either the package pin or for the socket into which the package may be inserted. In such a package, the magnitude of the current flowing through the highest current power pin may be reduced by configuring the resistance of the power plane(s) and vias to provide approximately the same total resistance to every power pin location. Slots may be cut in a package power plane to alter the current path and raise the impedance of the conduction path between some of the package power pins and the internal contact pads otherwise having the lowest impedance. If the package, such as a pin-grid-array package, includes more than one row of pins along an edge of the package, the internal package vias may be arranged to provide an impedance from die footprint to the outer row of pins which is not substantially higher than that of the inner row of pins. In this fashion the aggregate current carrying capacity of the carrier may be increased by reducing the difference in current flow between power pins having the highest current flow and power pins having the lowest current flow. The current flow through all the power pins may then be operated nearer to the design maximum of the particular connector used, or the design maximum of the carrier itself.

37 Claims, 21 Drawing Sheets

VOID
VOID
VOID
VOID 102
105
104
104
102
INDEX MARK
PIN 1 I.D.

EXTRA PIN
124
120

PIN 1 INDICATOR
.040 X 45°
125
122
125
124
SEATING PLANE

INTEGRATED CIRCUIT CARRIER ARRANGEMENT FOR REDUCING NON-UNIFORMITY IN CURRENT FLOW THROUGH POWER PINS

BACKGROUND OF THE INVENTION

1. Field of the Invention

The present invention relates to conductive planes within an integrated circuit carrier, such as a pin grid array package, for conveying power/ground to an integrated circuit attached to the carrier, and particularly relates to improving uniformity in current flowing through each of a plurality of external electrodes of the carrier connected to such a conductive plane.

2. Description of the Related Art

Integrated circuit carriers are well known in the art, and a wide variety of such integrated circuit carriers are readily available. Each type of carrier provides a physical body to which an integrated circuit die is attached, and usually affords a moderate to great deal of physical protection for the integrated circuit die. Frequently such integrated circuit carriers provide an enclosure having a cavity within which the die is attached and which is then covered by a protective lid. Other integrated circuit carriers protect an attached die using a molded plastic resin which surrounds the die. Typically, such carriers provide an electrical connection to the integrated circuit attached to the carrier by way of a number of external electrodes. For certain types of "leaded" carriers, such as a pin-grid-array (PGA) package, the external electrodes are package pins which extend from the body of the package. An example of such a package is shown in FIG. 1, which shows an integrated circuit carrier 100 having a body 102 and a number of external pins (one of which is labeled 104) extending from the bottom surface of the body 102. Other types of carriers provide external electrodes which are accessible on the surface of the carrier body, as with many "leadless" chip carriers (LCCs). Another type of package is shown in FIG. 2, which shows a ball-grid-array package 110, having a ceramic body 112 and a number of external compressible "balls" (one of which is labeled 114) extending from the bottom surface of the body 112.

PGA packages are readily available in both ceramic and plastic versions. While these package types are well known in the art, for clarity an orthogonal view of a ceramic PGA package is illustrated in FIG. 3, while an orthogonal view of a plastic PGA package is illustrated in FIG. 4.

As is well known in the art, integrated circuit carriers frequently include multiple wiring layers for making electrical interconnections within the carrier. Some of these layers may be arranged to provide a number of respective interconnections between a respective external electrode and a respective internal contact pad, and are typically used to route signals to or from the integrated circuit. The internal contact pads of the carrier may be arranged to provide for wire bond connections between the internal contact pads of the carrier and the bond pads within the integrated circuit die. Alternatively, the internal contact pads may be arranged to provide for solder bump connections to the die. Other layers may be arranged to provide one or more large planar conductive areas within the layer. Frequently such a conductive plane occupies an entire layer, and is often used to convey a power supply voltage (or a "ground" reference voltage) received on one or more external electrodes to one or more internal contact pads, which then are connected to the die by way of wire bonds, solder bumps, or other structures. In its simplest form, an integrated circuit carrier need only include one wiring layer, but most high performance carriers usually include several wiring layers. Vias are used within the carrier to couple a trace on one layer to a trace on another layer (or to a conductive plane).

Conductive planes are also frequently incorporated into portions of one or more wiring layers within an integrated circuit carrier. Such conductive planes provide an effective way to convey power supply voltages (as well as a "ground" reference voltage) to integrated circuit in a manner that has both low impedance and low inductance. These conductive planes are frequently called "power planes" irrespective of whether an actual "power supply" voltage, a "ground" reference voltage, an analog reference voltage, or some other voltage is actually conveyed on the conductive plane. As used herein, the term "power plane" should not be viewed as suggesting that a "power supply" voltage need be conveyed on such a power plane. In some cases, an entire wiring layer is utilized to provide a conductive plane for a particular power supply voltage or ground potential. In other cases, a portion of a wiring layer is used to provide a conductive plane in a region of the carrier.

The power consumption of many integrated circuit devices has increased as a result of ever higher levels of integration, and ever increasing speeds achievable. As a result, devices are commonly available having power dissipations that previously would have been unprecedented. For example, high performance processor devices today dissipate tens of watts and require packages having hundreds of pins. Even with dozens of package pins allocated to each major power supply voltage (e.g., internal VSS (source voltage from external power supply), I/O buffer VSS, internal VDD (drain voltage from external power supply), etc.) the magnitude of the current flowing through each of the power pins of the carrier must not exceed the maximum current specified for either the package or for the connector into which the package is inserted. Most connectors, by design, specify an upper limit for the magnitude of current flowing through each such pin. In some cases, modern connectors are limited to no more than one ampere (i.e., 1 A) of current per connector pin. Even with a large number of pins within the package allocated as power pins for a given power supply or ground connection to a power plane within a printed wiring board, the design of both the integrated circuit die and the package (and at times, the printed wiring board) must ensure that each such power pin conducts a current no higher than the design limit for the particular package and/or connector utilized.

While such maximum current flow limits may be problematic for many kinds of integrated circuits, the problems are particularly worrisome in the case of modern CPU devices, where the amount of current consumed is typically so much greater than with other kinds of devices. Previously, the current limitations per power pin were rarely exceeded, even when scant attention was paid to the amount of current flowing through each power pin. However, as devices conducting far higher currents than in the past are more widely utilized, additional care is needed to ensure that the maximum current per connector pin is not exceeded.

As an example, high performance microprocessor integrated circuits are frequently assembled into pin grid array packages (PGAs) and inserted into a pin grid array socket on a motherboard. The current demanded by such a microprocessor flows from a regulator (or regulator connection) on the motherboard, through the socket, through the pins of the PGA, through one or more power planes within the PGA, then through solder bump connections to "bonding pads" of the integrated circuit die itself. Similarly, the ground return current flows from the integrated circuit die, through the solder bumps, power planes, and connector pins, and then to the motherboard. When using motherboards and packages with high conductivity power planes (<1 milliOhm per square), the resistance of the PGA pin sockets (usually about 10 milliOhms) will dominate and the current flow will be relatively well distributed among the various PGA pins allocated to the power plane. However, ceramic PGA packages have significantly higher power plane resistance (e.g., 10 milliOhm per square) which significantly affects the pattern of current flow in the package power planes.

Thicker power planes within the package reduce the effective resistance per square of the power plane, and help distribute the current more evenly to a greater number of power pins of the package. Similarly, the use of multiple power planes in parallel also achieves a lower effective resistance. But such options are not always available when designing packages.

In spite of the long history of package designs that accommodate high pin-count and relatively high-current devices, the particular problems of high current flow through package and/or connector power pins become more difficult with each new generation of microprocessors. Consequently, there is a continuing need for improvements in package design.

SUMMARY OF THE INVENTION

Even though an integrated circuit package has a large number of power pins allocated to an internal power plane, the current flowing through the power pins may divide very unevenly, and result in current flow through some of the power pins which exceeds the maximum specification for either the package pin or for the socket into which the package may be inserted. Current flow is much higher through those package pins having a conductive path to one or more of the internal contact pads whose impedance is lower than most of the others. Because the power plane in a printed wiring board to which the package is frequently connected is typically so much lower in impedance than that of the power planes within the package, current flowing from the internal contact pads to the package pins tends to "dive" down to the motherboard along the path of least resistance, which path "hogs" more than the particular package pin's proportionate share of the total current. The min-to-max current ratio may easily be as high as 1:4, with the highest current package pins well above 1 ampere in current.

The magnitude of the current flowing through the highest current package pins is reduced by configuring the resistance of the pins, the power plane, and vias to provide approximately the same total resistance to every power pin location. Slots may be cut in one of the power planes to alter the current path and raise the impedance of the conduction path between some of the package pins and the internal contact pads otherwise having the lowest impedance. If the package includes more than one row of pins along an edge of the package, the internal package vias may be arranged to provide an impedance from die location to the outer row of pins which is not substantially higher than that of the inner row of pins.

In this fashion the aggregate current carrying capacity of a PGA package may be increased by reducing the difference in current flow between power pins having the highest current flow and power pins having the lowest current flow. The current flow through all the power pins may then be operated nearer to the design maximum of the particular connector used, or the design maximum of the package itself.

The present invention may be better understood, and its numerous features and advantages made even more apparent to those skilled in the art by referencing the detailed description and accompanying drawings of the embodiments described below. These and other embodiments of the present invention are defined by the claims appended hereto.

BRIEF DESCRIPTION OF THE DRAWINGS

FIG. 17 is a planar drawing illustrating an arrangement of power plane package pins useful with the power planes and vias shown in FIG. 14 through FIG. 16.

The use of the same reference symbols in different drawings indicates similar or identical items.

DESCRIPTION OF THE PREFERRED EMBODIMENT(S)

Figure 1:
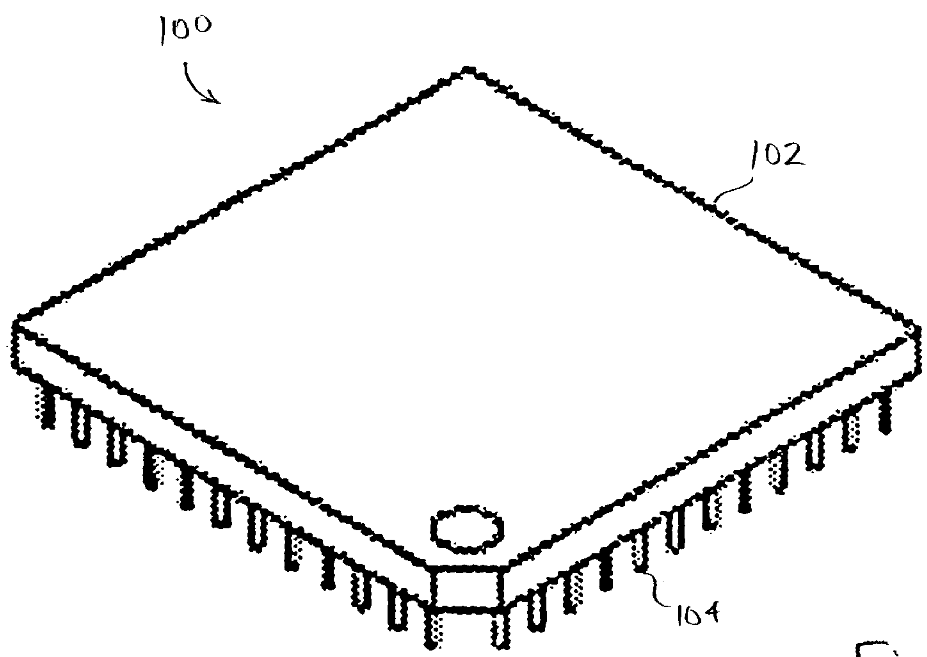
FIG. 1, labeled prior art, is an isometric drawing of a ceramic pin-grid-array (CPGA) package.
Figure 2:
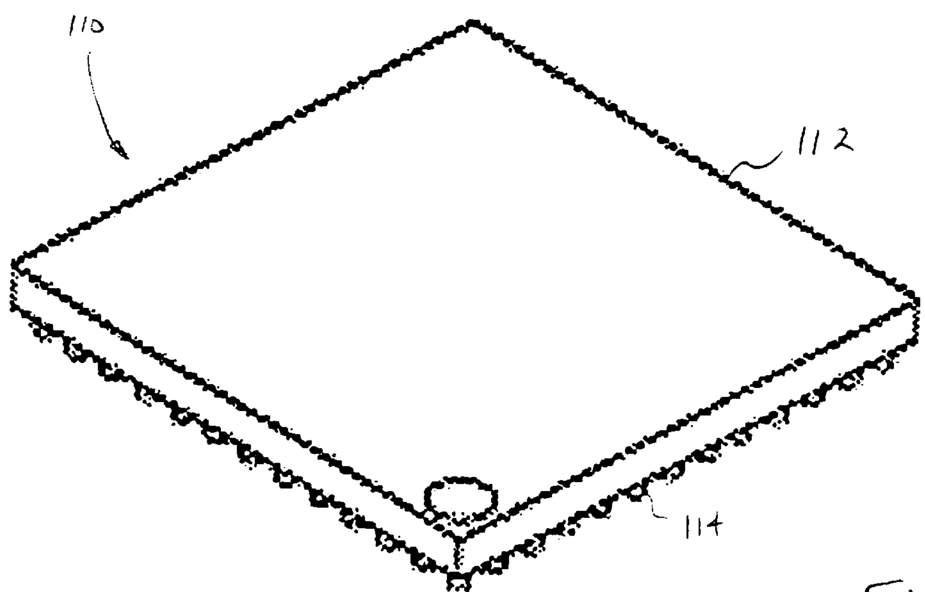
FIG. 2, labeled prior art, is an isometric drawing of a ceramic ball-grid-array package.
Figure 3:
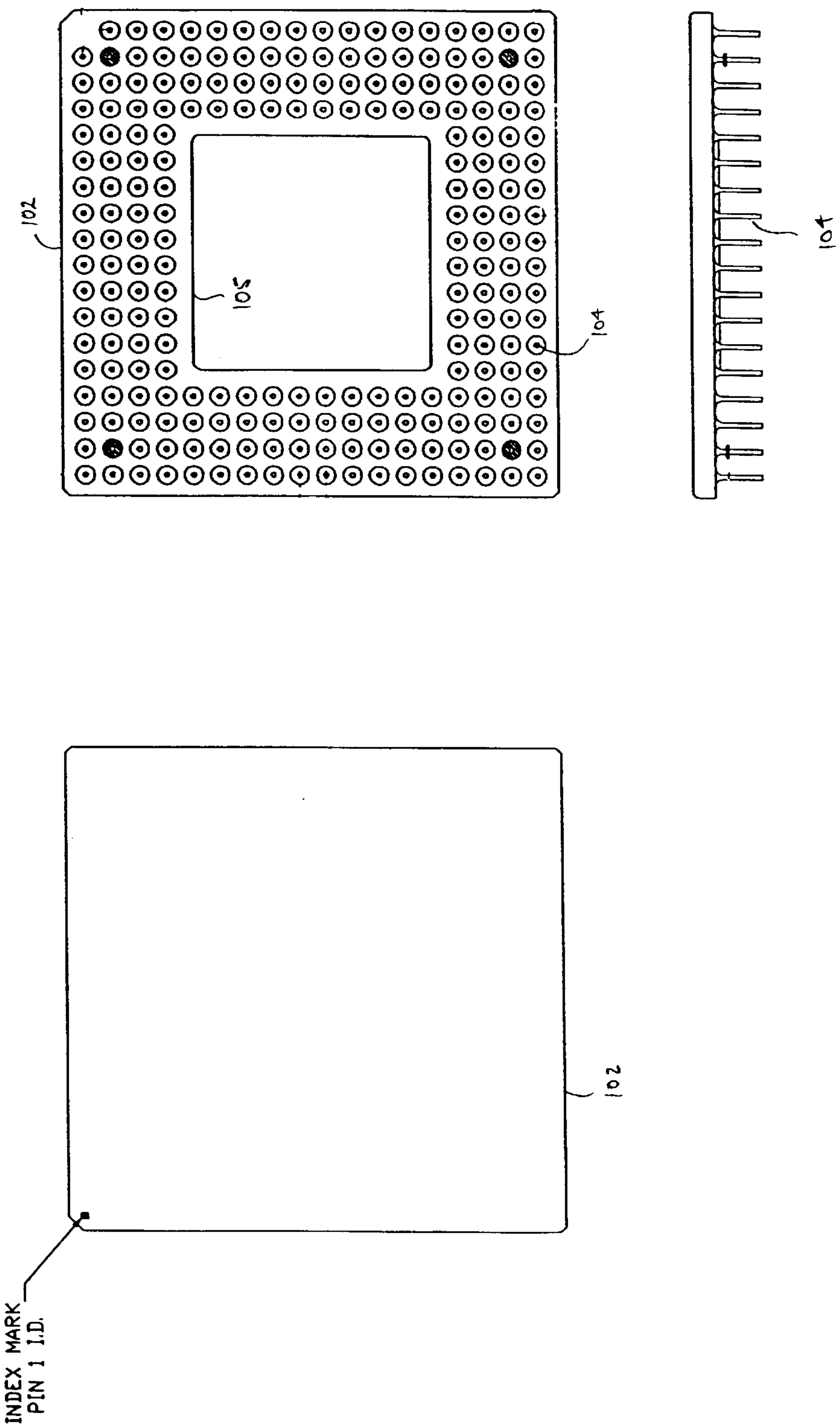
FIG. 3 is an orthogonal drawing illustrating in greater detail the ceramic PGA package shown in FIG. 1.
Figure 4:
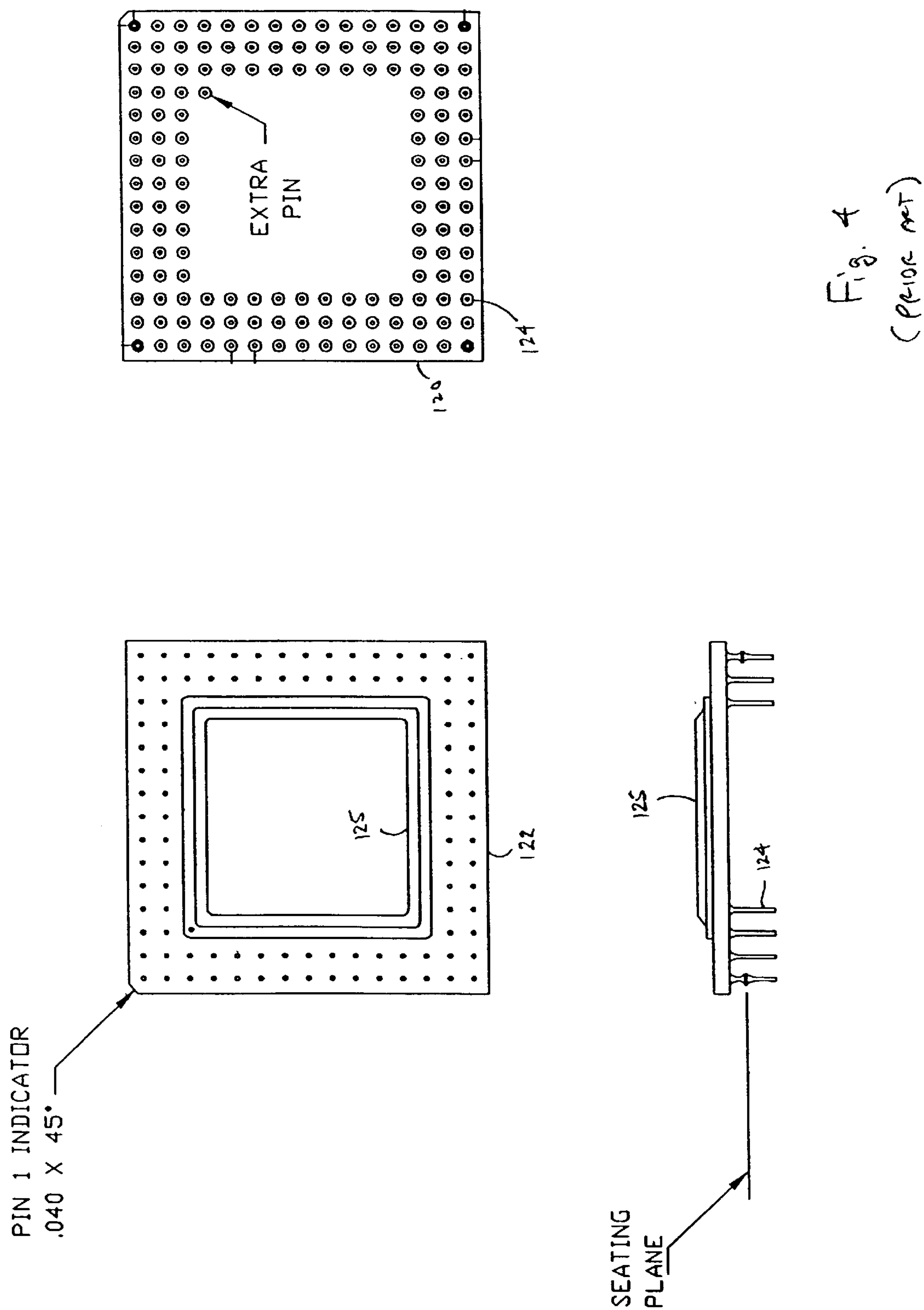
FIG. 4 is an orthogonal drawing of a plastic pin-grid-array (PPGA) package.

An analysis method was devised to model an integrated circuit die assembled in a PGA package which is inserted into a socket on a motherboard. The method may be used to calculate the current through each power pin of a PGA package (and the corresponding socket pin) as a function of: (1) the location of each power pin within the package; (2) the location of the power terminal connection(s) on the motherboard which provides the power to the motherboard power plane; (3) the resistivity of the power planes in both the motherboard and in the package; and (4) the extent and shape of each such power plane, especially the power plane within the package.

A mathematical spreadsheet model was devised to solve for the current distribution within the power planes and through each of the power pins. In the model, each power plane is divided into elements, such as a 1.27×1.27 mm square region (50 mils×50 mils). This grid size facilitates modeling a common package pin center-to-center spacing of 100 mils. Each element of a power plane is mathematically coupled to its four neighboring elements by a resistance that models the sheet resistance of the power plane. The current within a power plane into each element of the power plane is calculated as the respective voltage differential between a given element and the four adjacent elements divided by the respective resistance between the given element and the four adjacent elements. Moreover, each element of the package power plane is mathematically coupled to the corresponding element of the motherboard power plane beneath the package by another resistance that models a power pin which may be present at such element. Thus, the net current into each element of the power plane is calculated in accordance with Equation 1.

$$I_{element}=V_l/R_l+V_r/R_r+V_u/R_u+V_d/R_d+V_v/R_v. \quad \text{Eq. (1)}$$

In Equation 1, the subscripts l, r, u, d, and v correspond respectively to left, right, up, down, and vertical. The left, right, up, and down terms correspond to current flow to or from neighboring elements within the same power plane, while the vertical term corresponds to current flowing through a package pin between the package power plane and the motherboard power plane. Where a given element corresponds to a location of a power pin, the vertical resistance term, $R_v$, is set to a value corresponding to the resistance of the package/connector pin combination, and the corresponding term in the equation adds a contribution of current based upon the voltage difference between the corresponding locations in the two power planes and the resistance of the package pin and connector combination. At all elements not corresponding to the location of a power pin, the vertical resistance term is set to a value high enough (e.g., 10 MegOhms) to result in insignificant current flow between the two power planes at such location. The resistance of each element of the motherboard power plane is stored within a first two-dimensional array within the spreadsheet model. The vertical resistance between corresponding elements of the power planes are stored within a second two-dimensional array, and the resistance of each element of the package power plane is stored within a third two-dimensional array within the spreadsheet model.

Figure 5:
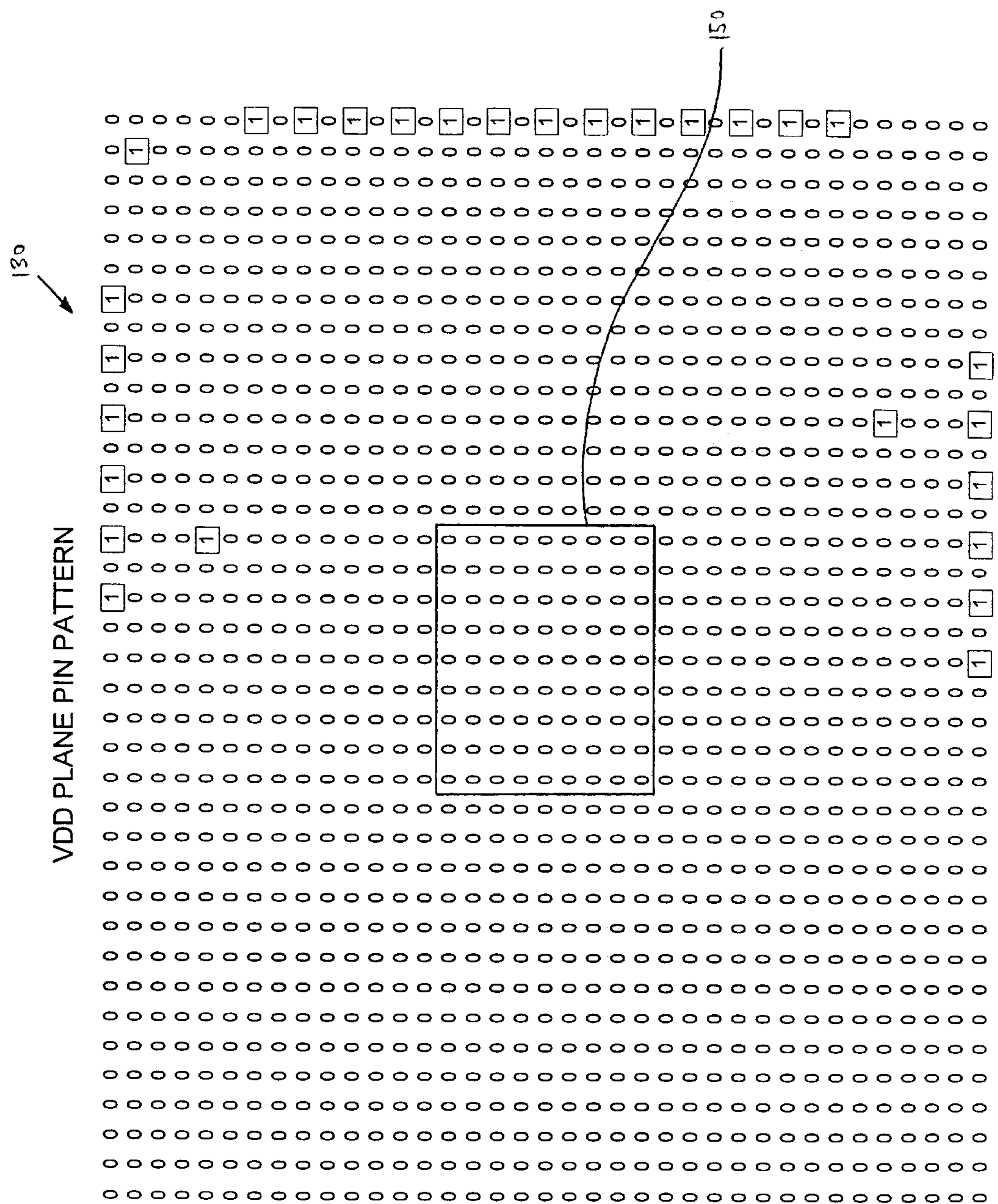
FIG. 5 is a print-out of a portion of a mathematical spreadsheet model for a package, which represents the locations of each power pin connected to a VDD power plane.

The footprint 130 of a particular PGA package having 321-pins is shown in FIG. 5. Each element corresponds to a 1.27×1.27 mm square region. A power plane for the VDD voltage (the “VDD plane”) extends throughout the package. Each grid or element location which corresponds to the location of a power pin that is connected to this VDD plane is indicated by a “1” in the figure. The vertical resistance at each such element is set to a value corresponding to the resistance of a package pin and connector combination, such as 10 milliOhms. The remaining elements, indicated with a “0” in the figure, correspond to locations either having no package pin at all, having a package pin connected to a different power plane, or having a package pin connected to a signal line within the package rather than connected to a power plane. Only the package pins allocated to the VDD power plane (actually connected internally to the VDD power plane), and which provide a VDD connection to the motherboard power plane, are indicated as a “1”.

In the spreadsheet model, the voltages calculated for each element of the motherboard power plane are stored within a fourth two-dimensional array, and the voltages calculated for each element of the package power plane are stored within a fifth two-dimensional array. To use the model, the elements of the package power plane representing the integrated circuit footprint are preferably forced to a convenient arbitrary voltage, typically 10 volts, and the elements of the motherboard power plane representing the power terminal connection to the motherboard power plane are forced to 0. The potential of each remaining element is then calculated by iteration until a stable solution is reached. As this particular method is not a particularly sophisticated solution technique, quite a few iterations are required of the spreadsheet model before a stable solution is reached. The calculation time may easily require 50–100 seconds using a 300 MHz personal computer. But when a stable solution is reached (i.e., maximum relative error per iteration of 1E−4), the current per power pin as a function of the position of the power pin within the package may be computed. When the voltage of the integrated circuit (i.e., die) footprint is set to 10 volts and the voltage of the power terminal connection to the motherboard power plane is set to 0 volts, a total amount of current flowing between the two regions will be determined by the model calculations. If this current is then normalized to a target value for the actual circuit of, for example, 30 amps, the voltage and currents may be scaled to determine the actual magnitude of the current flowing through each of the power pins of the package.

Figure 6:
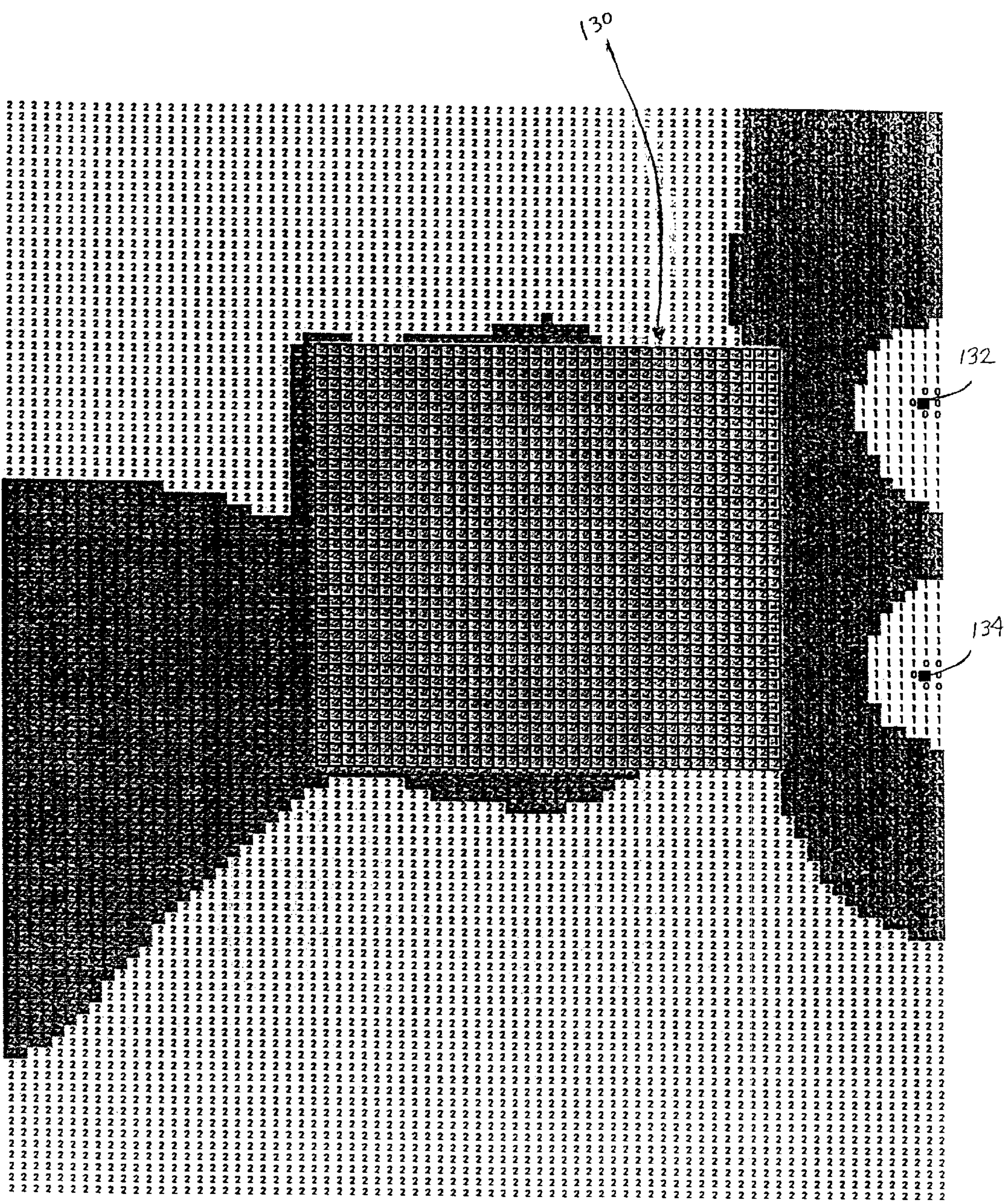
FIG. 6 is a print-out of a portion of a mathematical spreadsheet model for a motherboard to which the package depicted in FIG. 5 is inserted, which depicts the intermediate voltages for each modeled element within the motherboard power plane for a normalized 10 volt potential applied between the integrated circuit die footprint in the package and a pair of power terminals of the motherboard power plane.

FIG. 6 is a spreadsheet array (i.e., the fourth two-dimensional array described above) representing a motherboard to which the package is inserted, and which shows the voltage of each element on the motherboard. The package footprint 130 is shown, which represents the elements that may have vertical connection representing a package power pin connected to the VDD plane (as indicated in FIG. 5). The remaining elements of the motherboard use a current equation with only the four lateral terms representing current flow within the same plane (to reduce computational demands). Two connections to the power plane (labeled as 132, 134) are shown to the right of the package footprint 130. The single digit number shown for each element in FIG. 6 represents the voltage of that element, rounded to a whole number, assuming 10 volts is forced between the die footprint on the package power plane and the power connections 132, 134 to the motherboard power plane. While only one digit is shown which gives an approximate value visually of the voltage of a given element, the model preferably calculates the voltage to a much higher degree of precision than is depicted in FIG. 6. The voltage of the two power plane connections 132, 134 is each forced to zero, and the immediate neighboring elements show a voltage of near zero, as well. But, as the calculated voltages indicate, the voltage rises quickly as the distance from the power connections 132, 134 increases. The greatest portion of the motherboard power plane resides at a voltage of near 2 volts.

Figure 7:
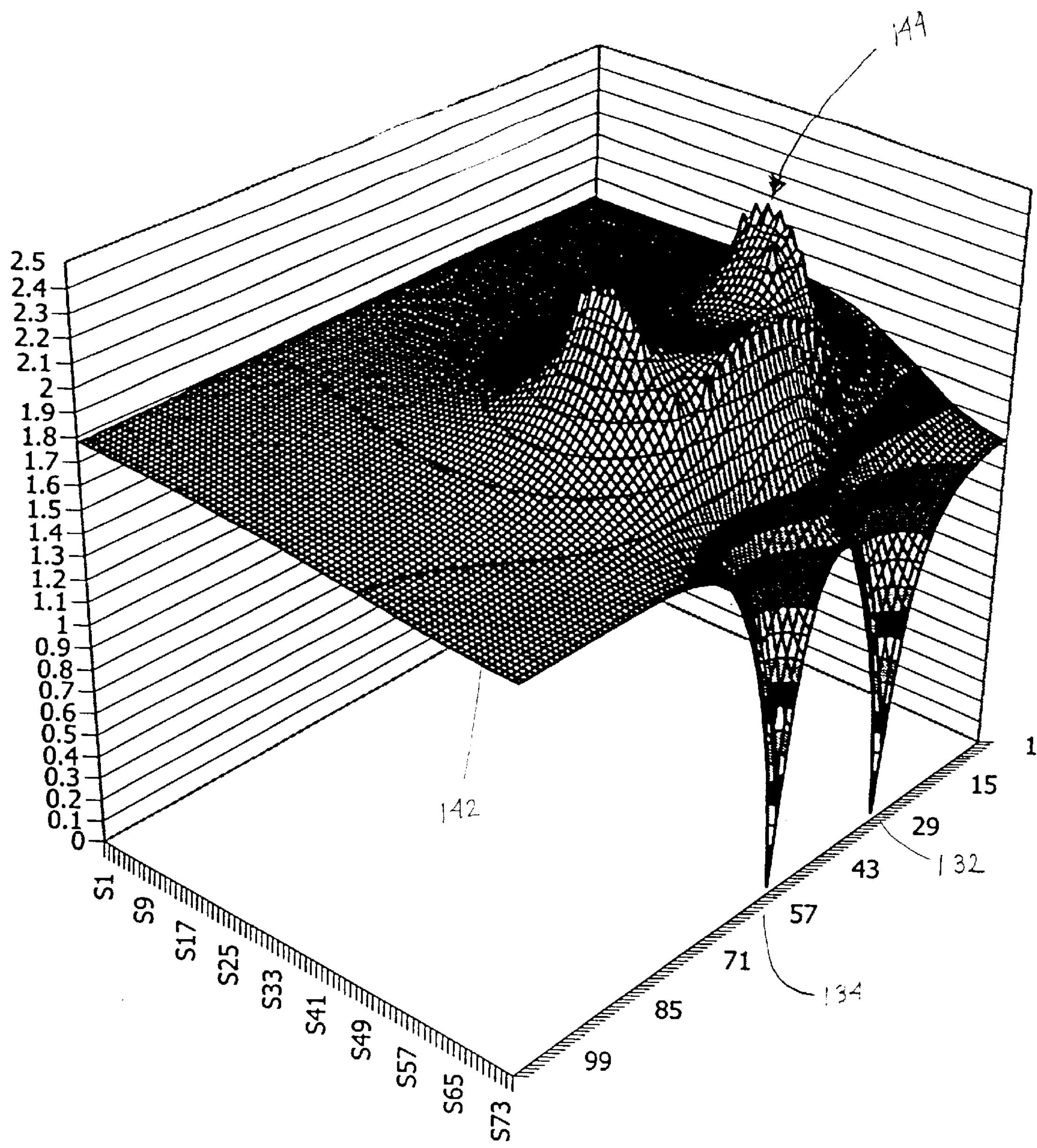
FIG. 7 is a three-dimensional chart illustrating the voltage of each element as calculated according to the model shown in FIG. 6.

In FIG. 6, by showing only one rounded off digit of the voltage of each of the elements, a rough impression may be discerned by observation of this figure. However, a three-dimensional representation is far easier to appreciate the contours of the voltages calculated thus far. Such a three-dimensional figure is graphed in FIG. 7. The magnitude of the voltage of each element within FIG. 6 is shown in FIG. 7 on the vertical scale. The height of the figure in a particular region corresponds to the voltage of the element within that region. As can be appreciated from FIG. 7, the portion of the motherboard power plane having the highest voltage are those portions near the VDD power pins of the package. For example, the VDD power pins along the top of the package correspond to the region labeled 144, which has a peak voltage of about 2.3 volts. Outlying portions of the motherboard power plane, such as that labeled 142, exhibit a relatively constant voltage through large regions of the plane because such regions have little lateral current flow between elements.

Figure 8:
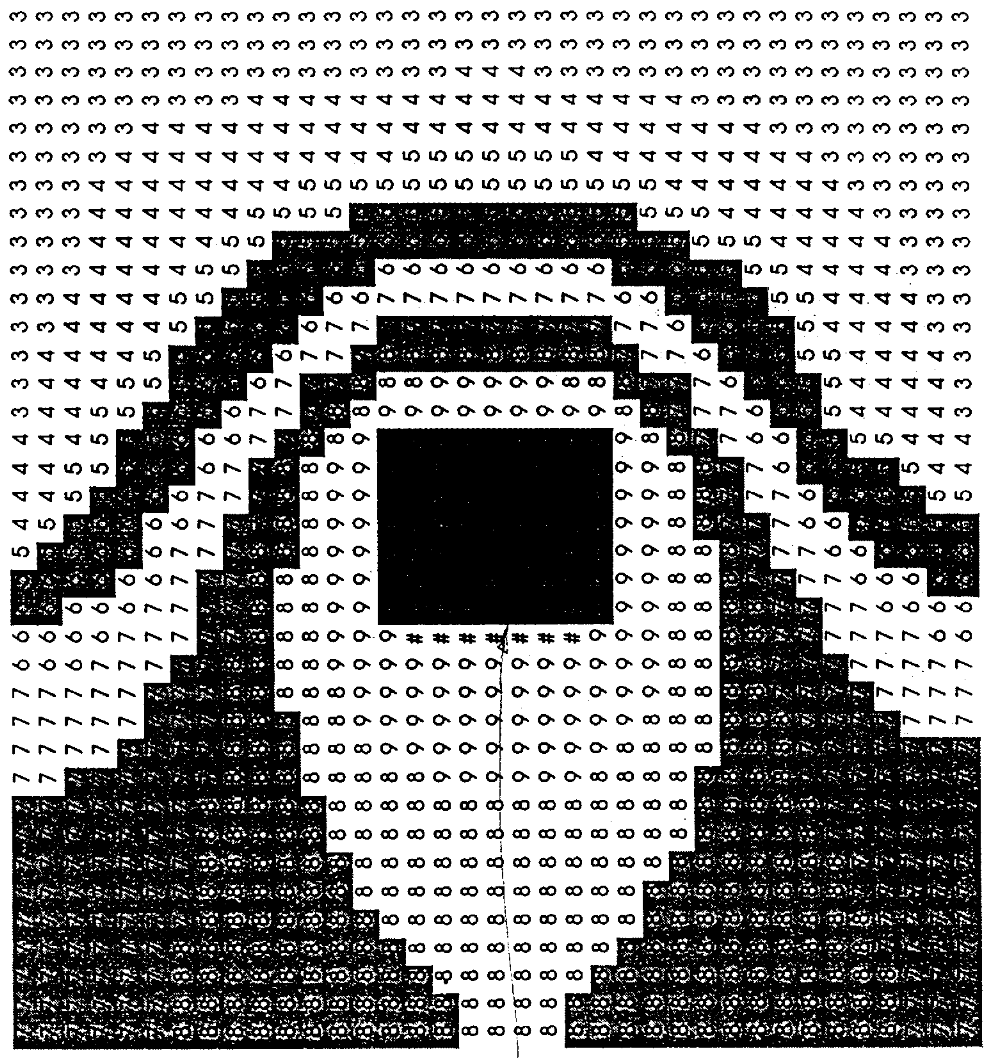
FIG. 8 is a print-out of a portion of a mathematical spreadsheet model for the package depicted in FIG. 5, which depicts the intermediate voltages for each modeled element within the package power plane for a normalized 10 volt potential applied between the integrated circuit die footprint in the package and a pair of power terminals of the motherboard power plane.
Figure 9:
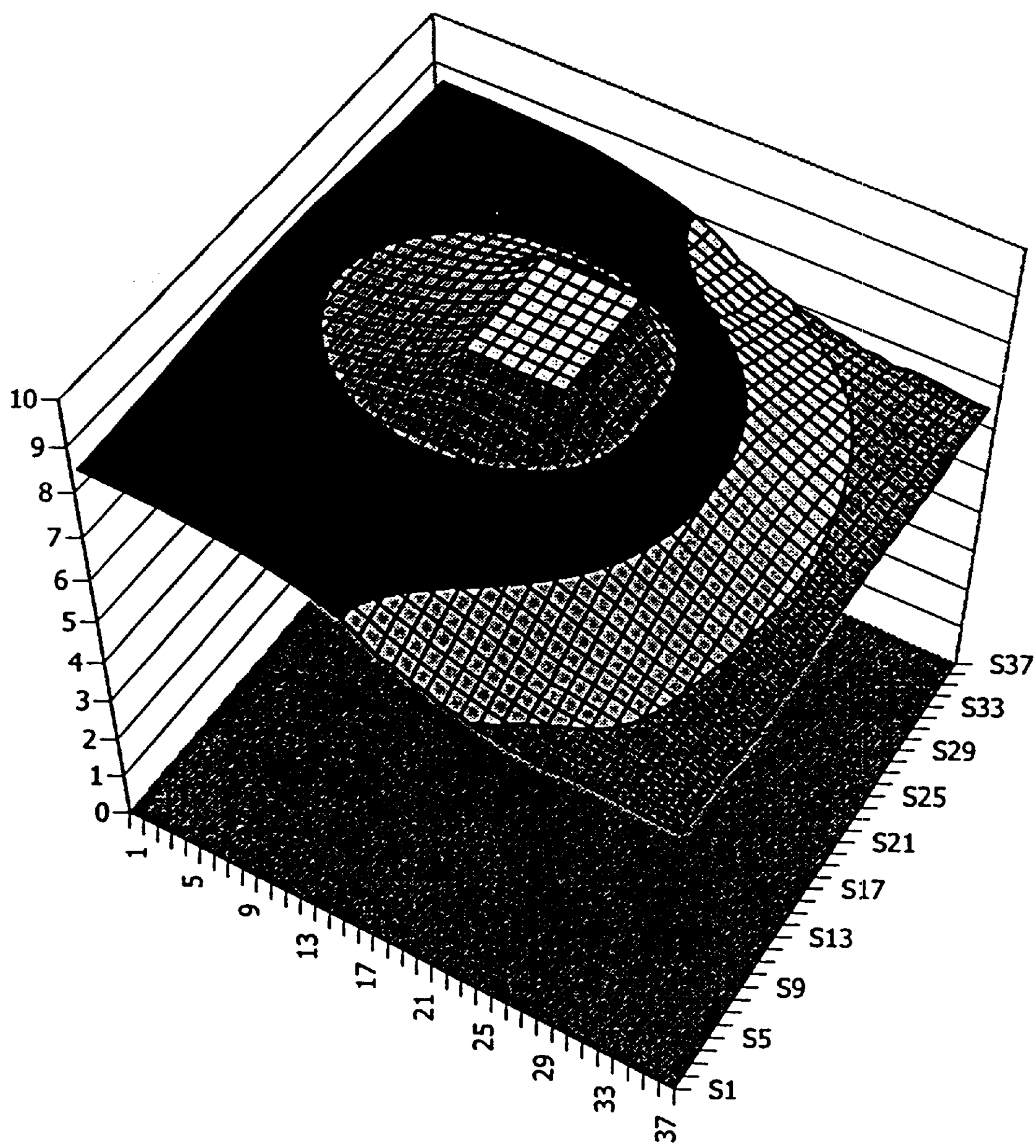
FIG. 9 is a three-dimensional chart illustrating the voltage of each element as calculated according to the model shown in FIG. 8.

Referring now to FIG. 8, the calculated voltage for each element within the package power plane is depicted, again by rounding the calculated voltage to a single digit. The footprint of the integrated circuit die is labeled as 150, and each element within the footprint is forced to 10 volts. The "pound signs" just to the left of the footprint 150 correspond to, as is common with many spreadsheets, a number that is larger than fits within the formatted size of each cell. In this case, the pound signs represent a 10 volt value. Since all the VDD power pins are located on the right half of the package, the voltage of the right side reaches around 3 volts, and is lower than the voltages on the left side. Because the resistance of the package power plane (e.g., 20 milliOhm per square) is so much higher than the motherboard power plane (e.g., 2 milliOhm per square), the voltage drop from the die footprint to the location of the package power pins is much greater than the voltage drop on the motherboard between the package connector pins and the power terminal connections 132, 134 to the motherboard. A three-dimensional representation of the package power plane voltage is graphed in FIG. 9. The magnitude of the voltage of each element within FIG. 8 is shown in FIG. 9 on the vertical scale. As before, the height of the figure in a particular region corresponds to the voltage of the element within that region. Note that the vertical scale is much larger than in FIG. 7, so that the voltage drop within the package power plane shown in FIG. 9 is actually much larger than the voltage drop within the motherboard power plane shown in FIG. 7, even though the contour appears to be "smoother."

Figure 10:
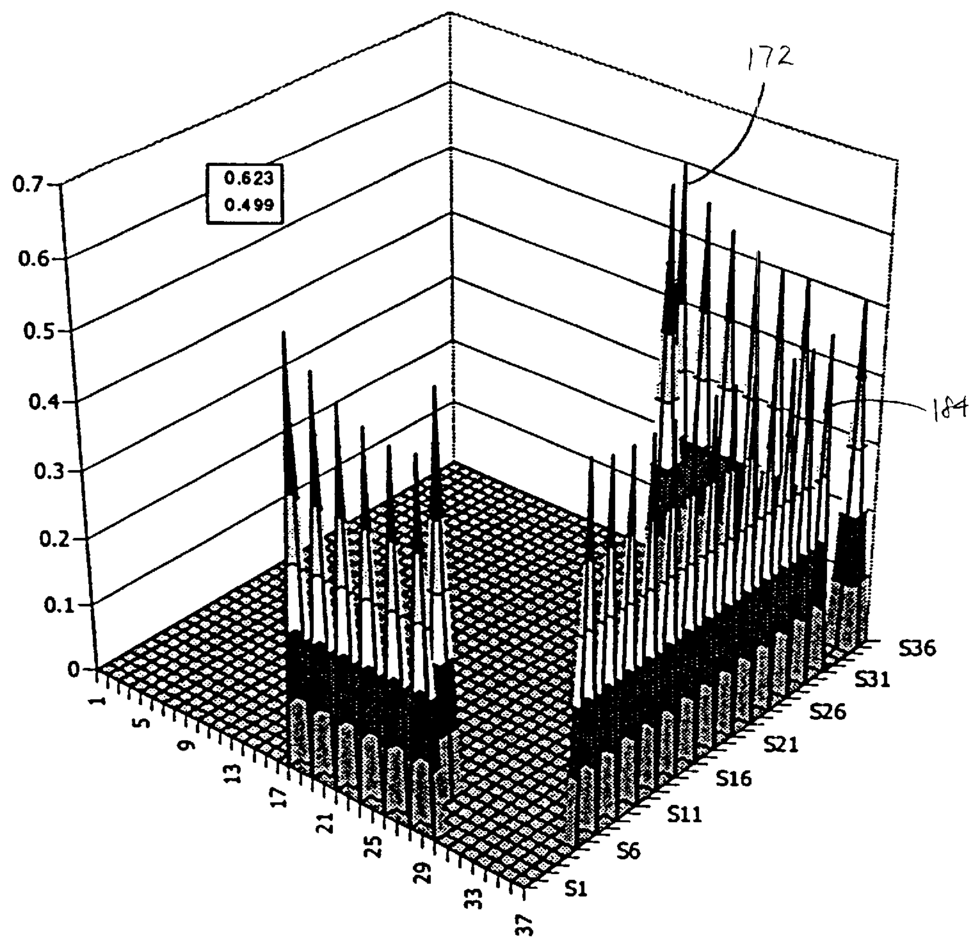
FIG. 10 is a three-dimensional chart illustrating the magnitude of current flow through each of the VDD power pins of the package shown in FIG. 5, for a particular set of assumptions for the resistance of the power planes and the resistance of the connector pins.

The current through a power pin at a given location is calculated by observing the differential between the element voltage on the package power plane compared to the voltage of the corresponding element of the motherboard power plane (to which the corresponding power pin of the package is connected). Such a current calculation may be normalized by adjusting this calculated current flow by the appropriate ratio between the computed total current through all power pins (based upon a 10 volt differential) and the actual current of interest for the integrated circuit. The normalized currents for the case considered thus far (i.e., 15 A total current, 10 milliOhm per connector pin, 20 milliOhm per square package power plane, and 2 milliOhm per square motherboard power plane) are three-dimensionally depicted in FIG. 10 as a function of position of the VDD power pin on the PGA footprint. The current through the various power pins ranges from a high of 0.623 amps (for the pin labeled 172) to a low of 0.499 amps (for several of the pins, such as the one labeled 174).

Figure 11:
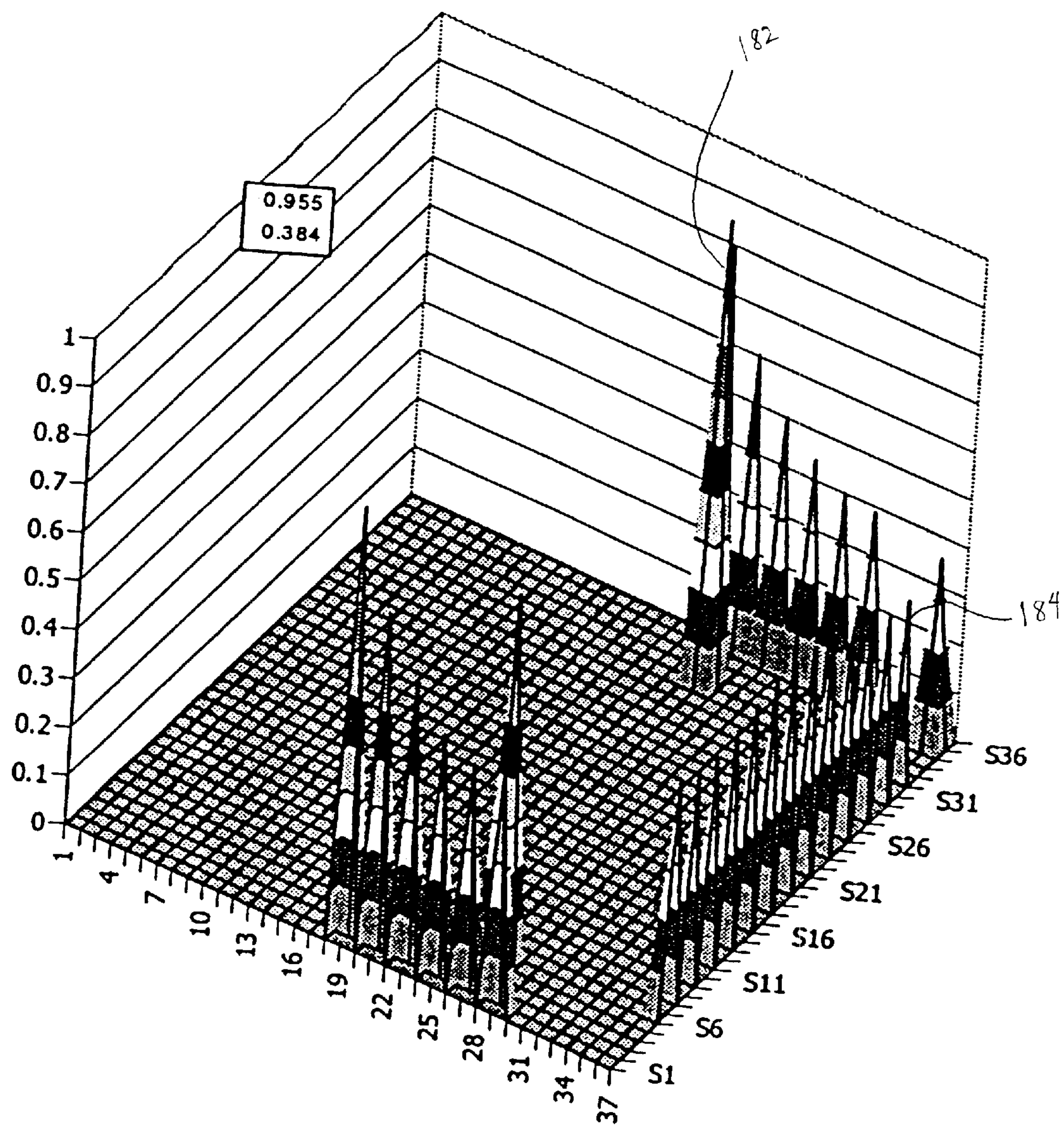
FIG. 11 is a three-dimensional chart illustrating the magnitude of current flow through each of the VDD power pins of the package shown in FIG. 5, for another set of assumptions for the resistance of the power planes and the resistance of the connector pins.

Having described the model used to calculate current through each power pin, the various parameters may be varied to determine the impact upon the magnitude of current flow through each power pin. For a first example, the total DC current drawn from VDD is set to 15 amps. A PGA package having two VDD power planes of co-fired tungsten having a nominal resistivity of 10 milliOhms per square is assumed. Other metals, such as molybdenum, are also particularly useful for such a package. The package allocates 28 pins to the VDD supply, with a pinout as shown in FIG. 5. The PGA socket has a maximum specification for the resistance per pin of 10 milliOhm (but it can be lower, as described below in another variation). Under these assumptions the current per pin was calculated, and is depicted in FIG. 11. The current through the various power pins ranges from a high of 0.955 amps (for the pin labeled 182) to a low of 0.384 amps (for several of the pins, such as the one labeled 184).

However, if the package pin/socket combination has an average resistance less than the specification, such as only 5 milliOhms, the current levels diverge, and yield a maximum of about 1.2 amps and a minimum of about 0.34 amps. Worse yet, if the resistivity of the package power planes are higher than specified, the current levels diverge even more.

Figure 12:
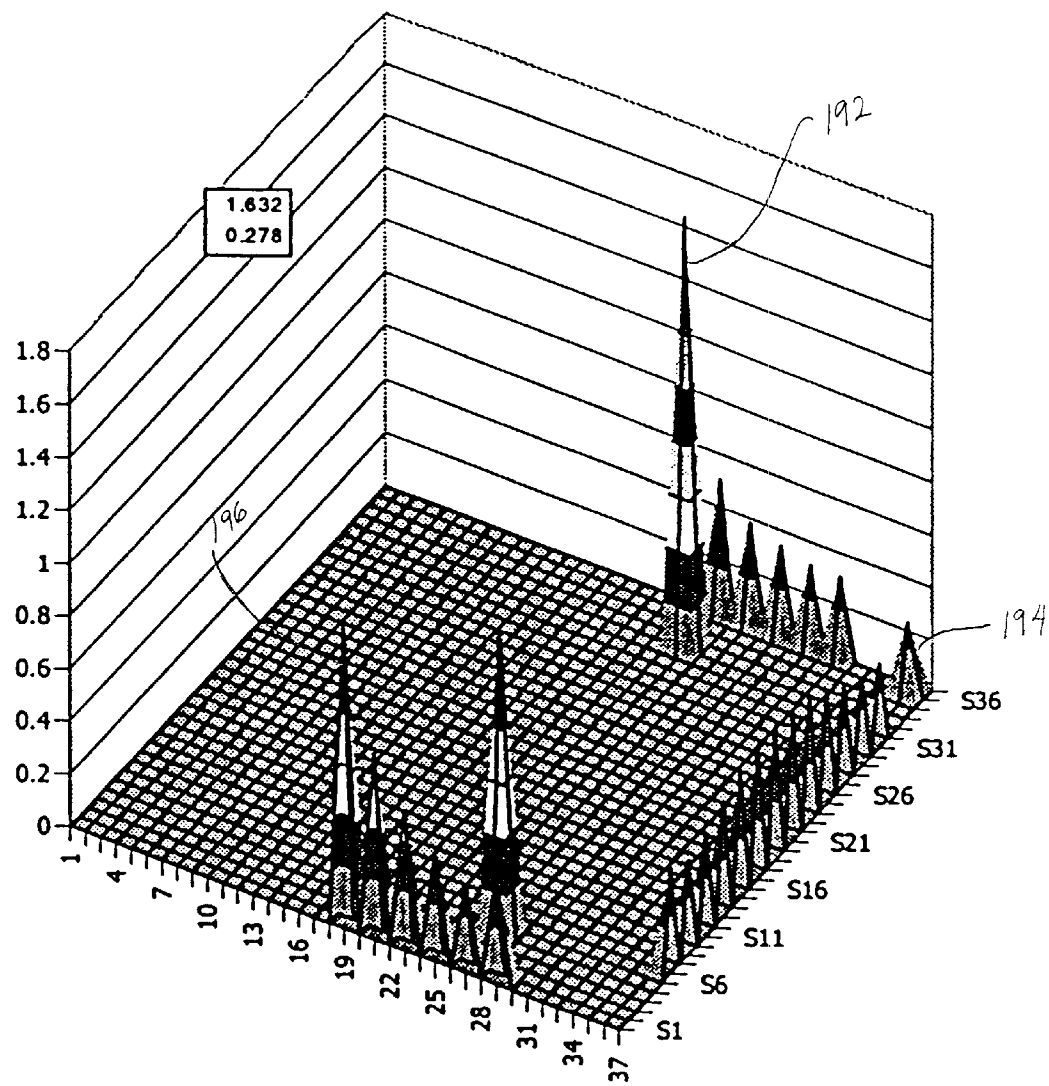
FIG. 12 is a three-dimensional chart illustrating the magnitude of current flow through each of the VDD power pins of the package shown in FIG. 5, for yet another set of assumptions for the resistance of the power planes and the resistance of the connector pins.

Such a situation may not be unusual, given that sintered tungsten typically has a higher resistivity (e.g., about 25 μohm-cm) than does pure bulk tungsten (e.g., about 5.5 μohm-cm). In such a case, as depicted in FIG. 12, the current through the various power pins ranges from a high of 1.632 amps (for the pin labeled 192) to a low of 0.278 amps (for the pin labeled 194). Only a few pins have high currents where the current takes the path of least resistance and plunges onto the motherboard power plane at the nearest available pin rather than struggling along in the high resistivity tungsten power plane of the package. If the two highest current pins are removed (those labeled 192, 196) and the calculations performed again, the ratio improves from 1.6/0.3 to 1.4/0.35.

Figure 13:
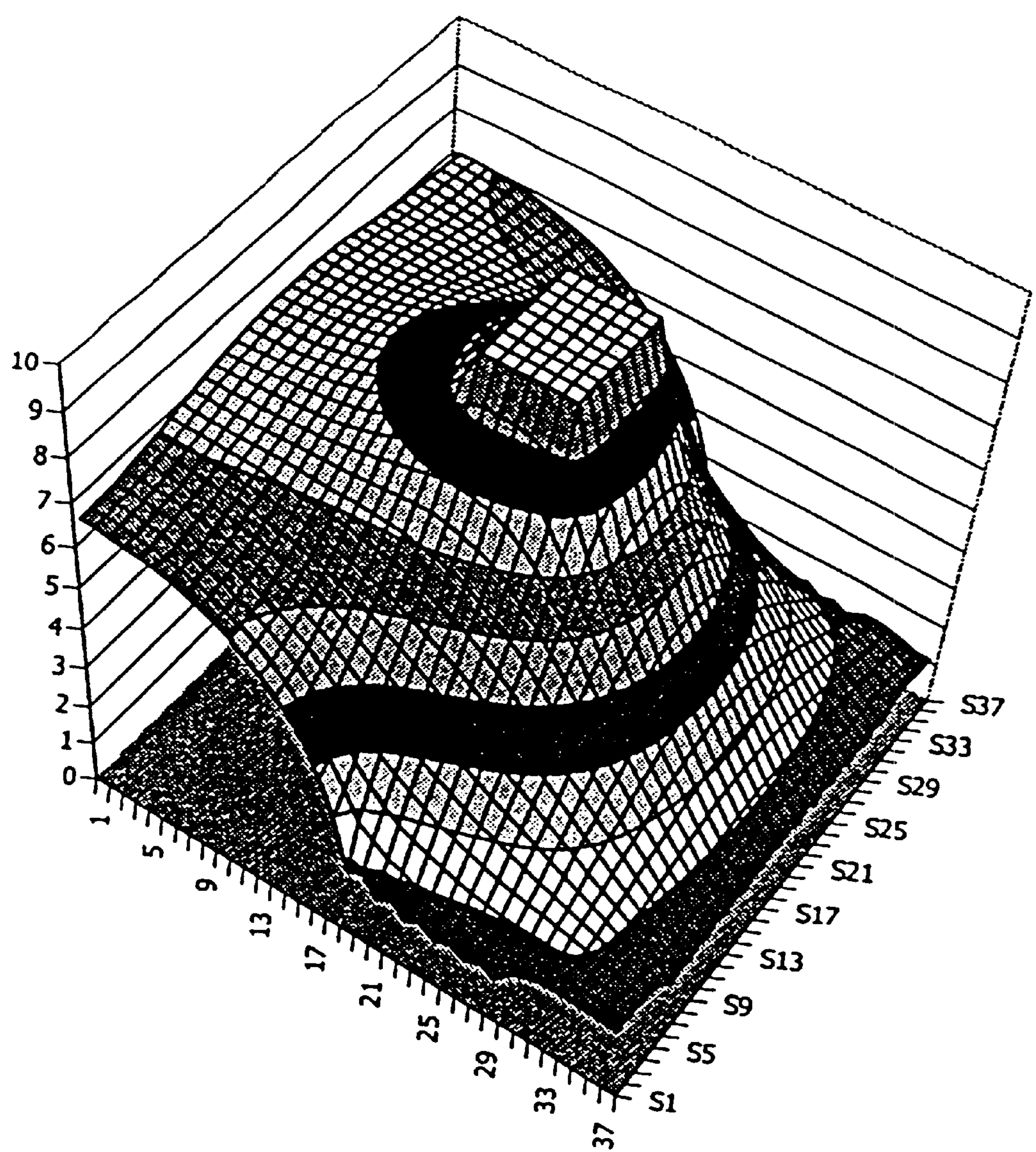
FIG. 13 is a three-dimensional chart illustrating the voltage of each element as calculated according to the assumptions corresponding to FIG. 12.

The exact placement of the power terminal connections 132, 134 on the motherboard has little influence upon these results since the voltage drop across the relatively thick copper motherboard power plane is only about 10% of the total voltage drop between the integrated circuit die footprint and the power terminal connections 132, 134 on the motherboard. The largest voltage drop is within the package power plane, as shown in FIG. 13, in which a scale of 0 to 10 corresponds to 100% of the voltage drop.

The analysis described thus far illustrates that, for cases with relatively high package power plane resistance, the power pins having the lowest resistance conduction path (from the integrated circuit die footprint) conduct an inordinate share of the total current and easily may result in current flow exceeding the connector pin specifications.

Figure 14:
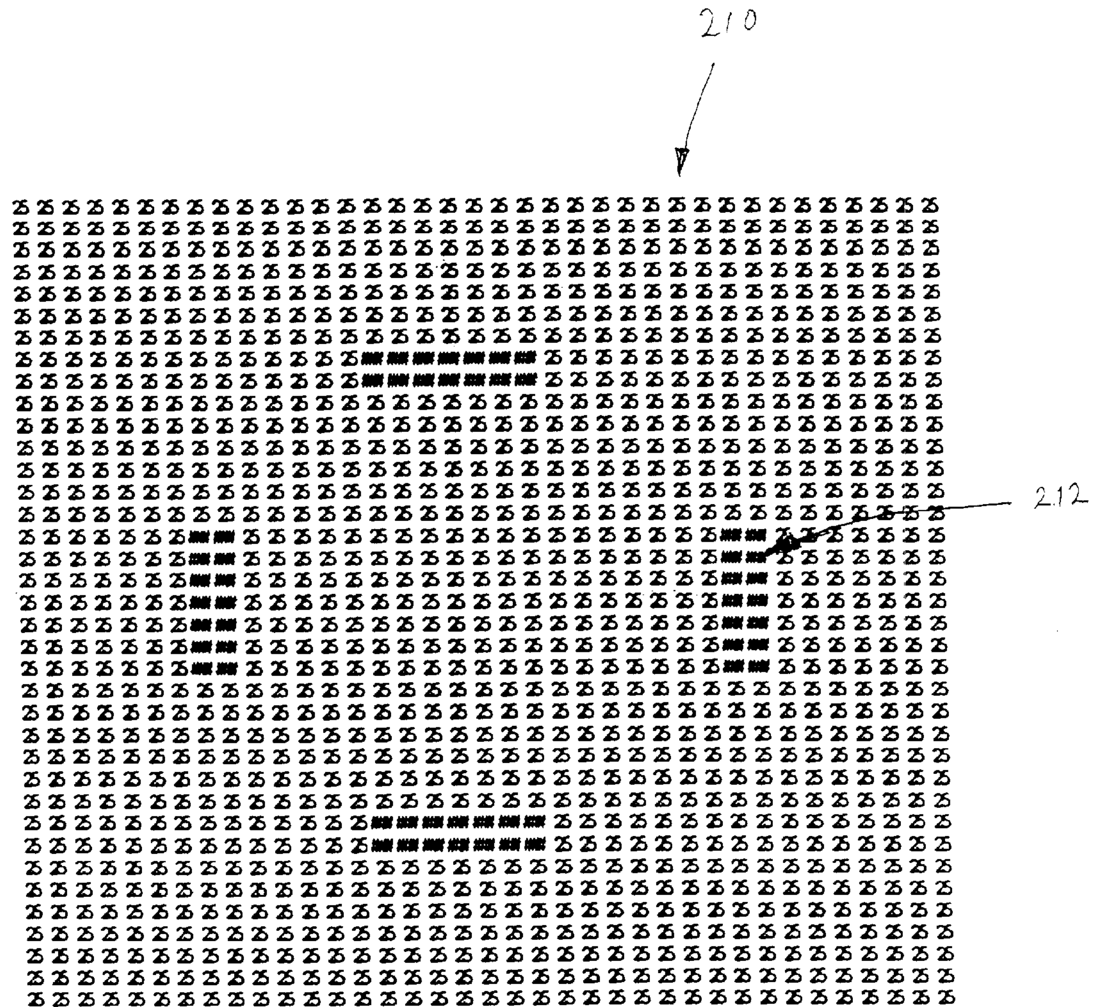
FIG. 14 is a planar drawing illustrating an arrangement of an upper power plane formed in a package in accordance with the present invention.

An improved package design will now be described. FIG. 14 shows a spreadsheet model representation of the resistance per element of a first, upper power plane 210 within the package. The number at each location within FIG. 14 corresponds to the resistance per square of the power plane at that location. For example, the resistance per square of most elements is indicated in the figure as a "25" which corresponds to 25 milliOhms per square for the tungsten layer forming the upper power plane 210. The "pound signs" (such as those labeled 212) correspond to, as is common with many spreadsheets, a number that is larger than fits within the formatted size of each cell. In this figure, the pound signs represent an absence of metal corresponding to a void or "slot" formed in the power plane, and which slot is numerically represented by an ohms per square value of 1E+07 or 10 meg ohms per square. In this way, a uniform mathematical treatment may be applied in terms of summing the current into each node.

Figure 15:
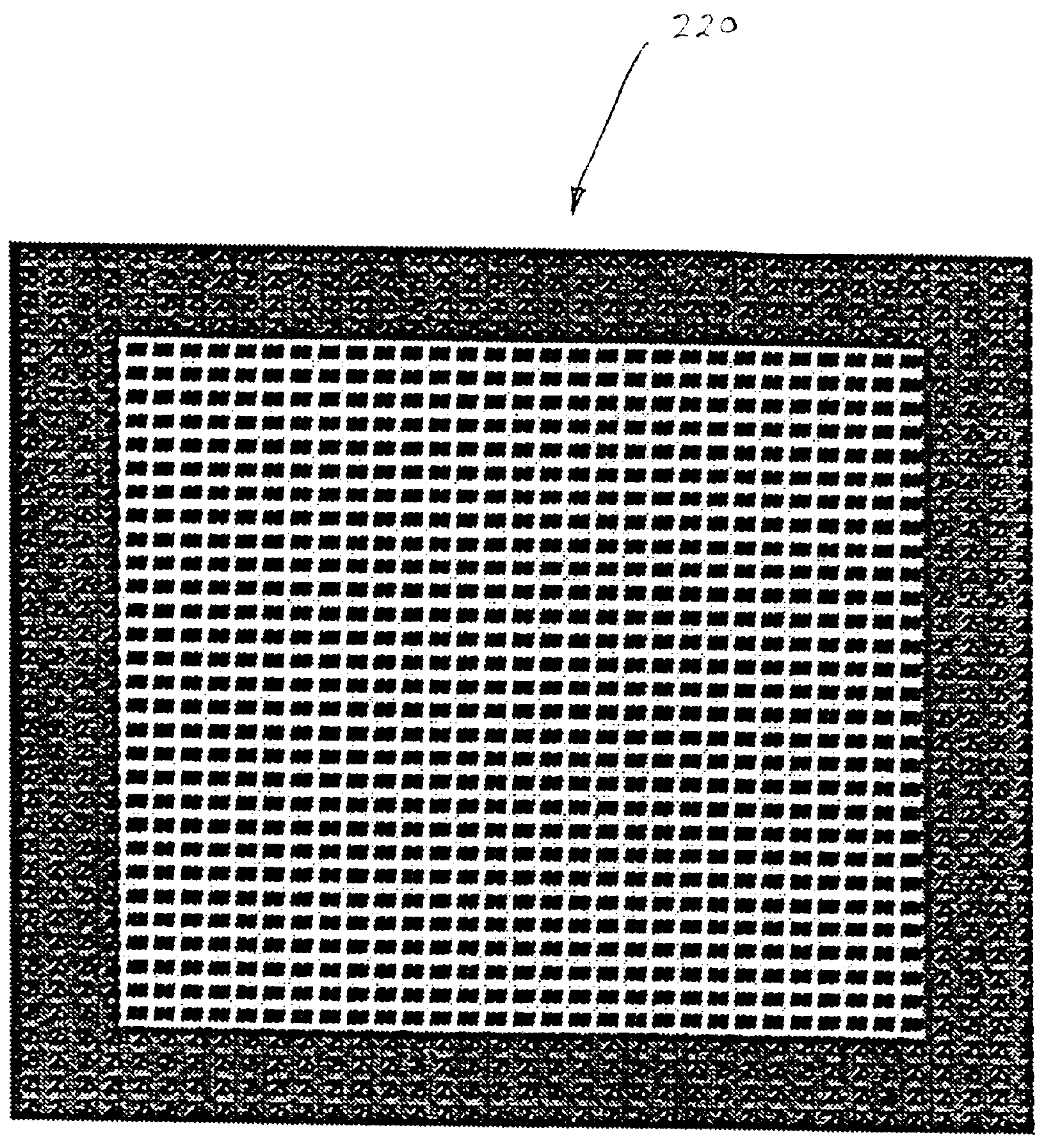
FIG. 15 is a planar drawing illustrating an arrangement of a lower power plane formed in a package in accordance with the present invention.

A second, lower power plane 220 for this embodiment is depicted in FIG. 15, which shows a spreadsheet model representation of the resistance per element of the lower power plane 220 within the package. This lower power plane 220 is shaped as a rectangular annular ring, and only exists in the region of the power pins around the outer periphery of the package which are connected thereto (as described below). The entire central portion of the lower power plane 220 is devoid of conductive material (i.e., metal), and is represented by "pound signs" corresponding to 1E7 ohms per square. The resistance per square of the peripheral rectangular ring itself (the only conductive portion on this layer of the package) is indicated in the figure as a "25" which, as before, corresponds to 25 milliOhms per square for the tungsten layer forming the lower power plane 220.

Figure 16:
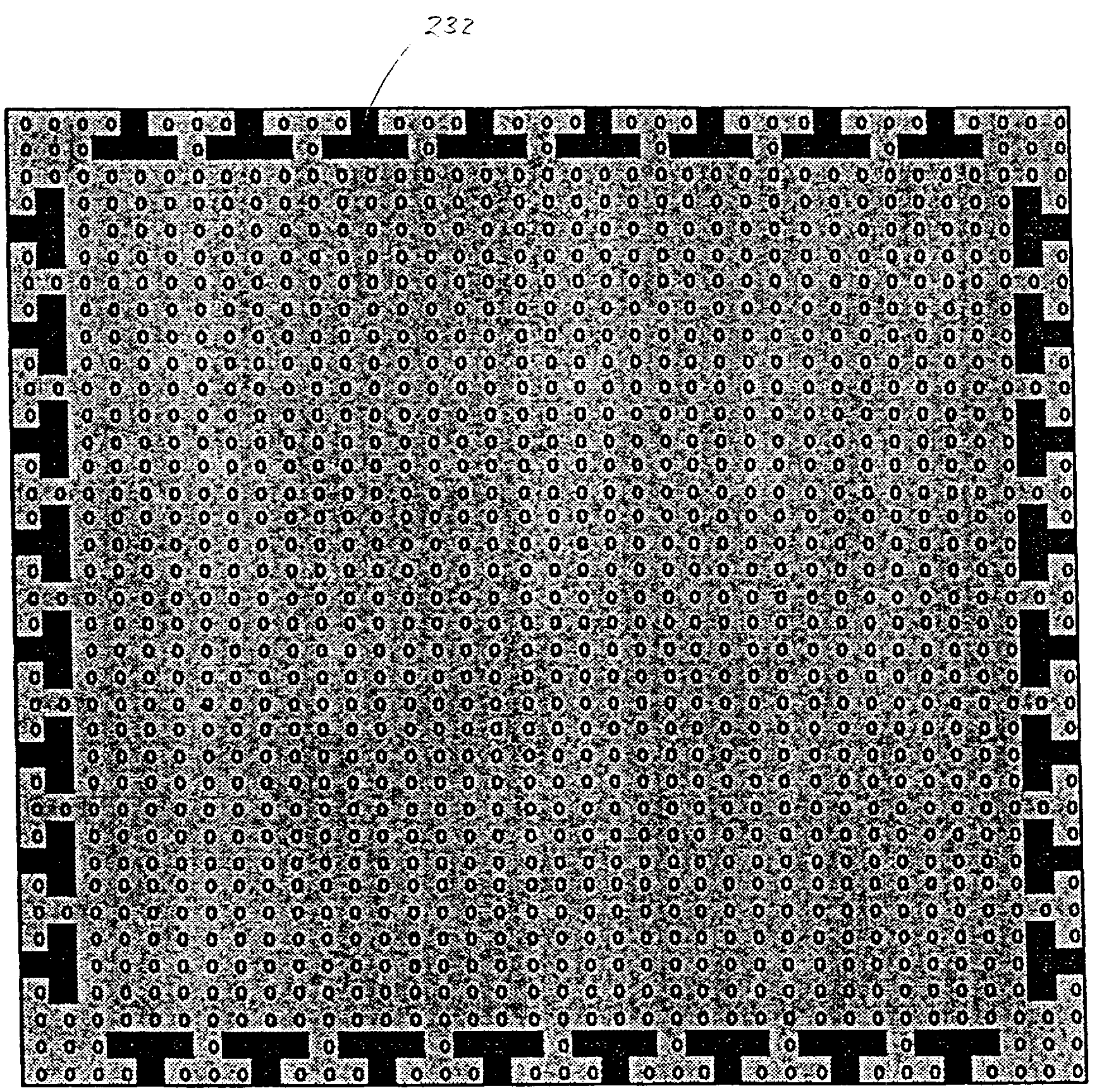
FIG. 16 is a planar drawing illustrating an arrangement of vias interconnecting the upper power plane shown in FIG. 14 to the lower power plane shown in FIG. 15.
Figure 17:
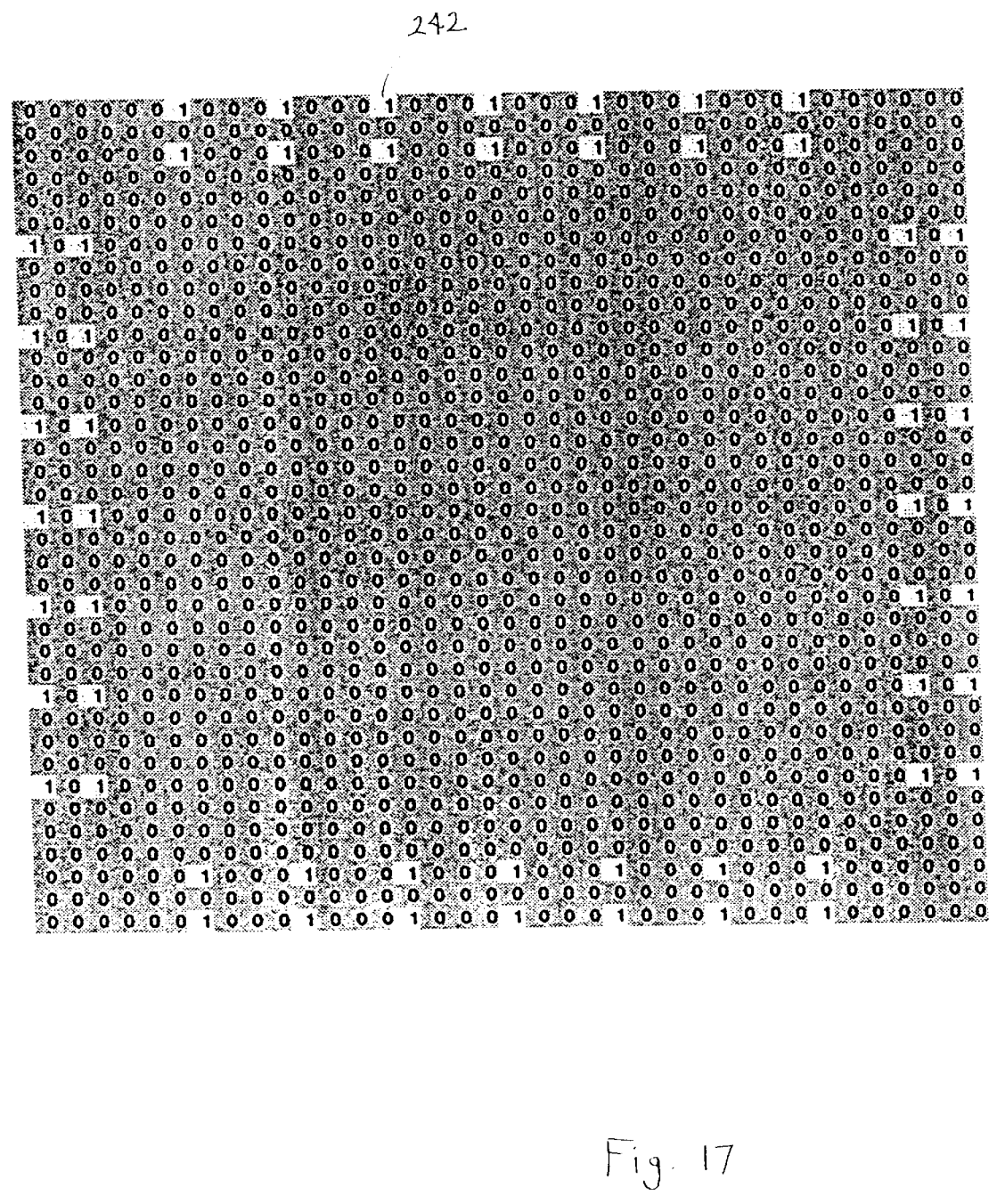

The upper and lower power planes 210, 220 are interconnected by a large number of internal package vias, as shown in FIG. 16. Each darkened element (such as that labeled 232) represents a 50 mil (1.27 mm) square element containing four vias, each having a preferred diameter of approximately 200 microns, connecting the upper power plane 210 to the lower power plane 220. Finally, a group of power pins (e.g., VSS pins, one of which is labeled as 242) are provided in the package which connect to the lower power plane 220, and are depicted in FIG. 17. The arrangement of power pins is a symmetric arrangement with an equal number of pins placed along each of the four sides of the package, and arranged to form an inner row and an outer row of pins, generally evenly spaced apart.

Figure 18:
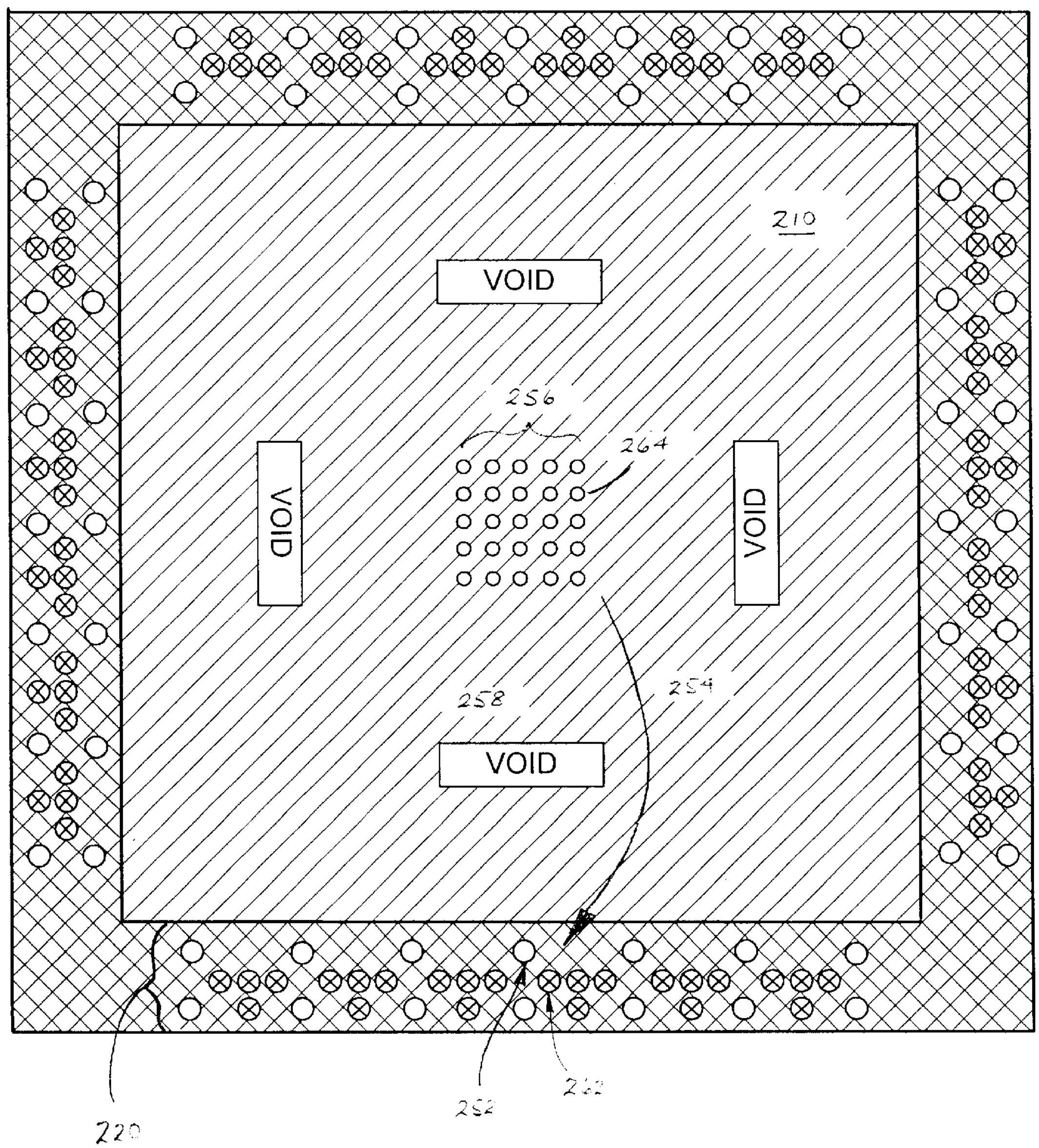
FIG. 18 is a planar drawing illustrating, on a single drawing, the upper power plane shown in FIG. 14, the lower power plane shown in FIG. 15, the vias shown in FIG. 16, and the power plane package pins shown in FIG. 17.

The upper and lower power planes 210, 220, the vias 232, and the package power pins 242 as described above are shown together in FIG. 18 to better illustrate the arrangement of this embodiment. Several observations may be apparent, but warrant emphasis here. First, the voids in the first power plane are preferably located symmetrically along the horizontal and vertical centerlines of the package, and each void preferably intersects its respective centerline perpendicular to the centerline. If no voids were present, the conduction path between the central region of the upper power plane 210 (where the internal contact pads 264 for the integrated circuit die are located) and a power pin located on a vertical or horizontal centerline would be lowest in impedance, and would shoulder a disproportionate share of the current, as described above. By locating these voids along the centerlines, the lowest impedance conduction path is increased to be closer in magnitude to the other conduction paths between the central region and the various other power pins. The resulting conduction path to the closest power pin 252 is longer than before, and is labeled 254.

The conductive path 254 begins at the central region 256 and flows around either side of the void 258 to the general vicinity of the power pin 252. Since the power pins are only connected to the rectangular ring of the lower power plane 220, the current flows first through the vias nearby power pin 252, such as via group 262, and then on to power pin 252. The via groups (each representing four 200 μ diameter vias) are located further from the central region than the inner row of power pins so that the resistance of the conduction path to an inner row power pin is better matched (and almost as high) to the resistance to an outer row power pin.

Similar and adjacent structures (not shown) are preferably provided for the VDD power planes, vias, and power pins to ensure, to a good approximation, that the anti-parallel and adjacent current flows between VDD and VSS that occur at DC will also exist over the complete range of frequencies as the inductance and capacitance terms overtake the DC terms. In this way, the overall impedance (i.e., especially the inductance term) of the power distribution system is reduced and all currents have close anti-parallel neighboring currents, such that the far magnetic fields will rapidly cancel with distance, thereby providing a package and system from an EMI/EMC (Electromagnetic Interference/Electromagnetic Compatibility) perspective.

Figure 19:
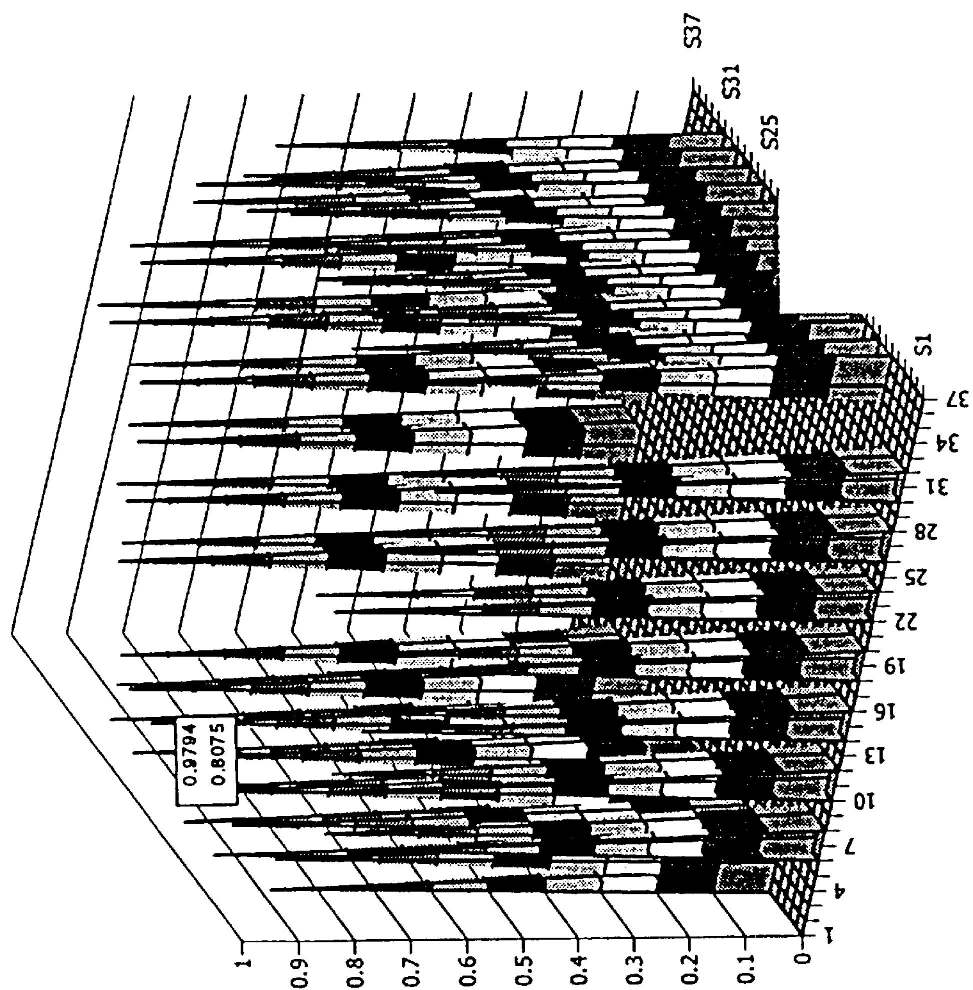
FIG. 19 is a three-dimensional chart illustrating the magnitude of current flow through each of the VSS power pins of the arrangement depicted in FIGS. 14–17, for a set of assumptions for the resistance of the power planes and the resistance of the connector pins.

This 321-pin package arrangement, having 56 power pins allocated to the VSS power planes, was modeled using the techniques described above for an integrated circuit drawing a total current of 50 amps. The resulting current per VSS power pin for a ceramic PGA package having 20 milliOhm per square tungsten power planes is depicted in FIG. 19. The highest current is approximately 0.98 amps, and the lowest is approximately 0.81 amps. By increasing the impedance of the otherwise lowest resistance conduction paths to power pins, the min-to-max spread in current per pin is dramatically reduced. As can be appreciated in the figure, the current through each power pin is extremely well balanced.

Figure 20:
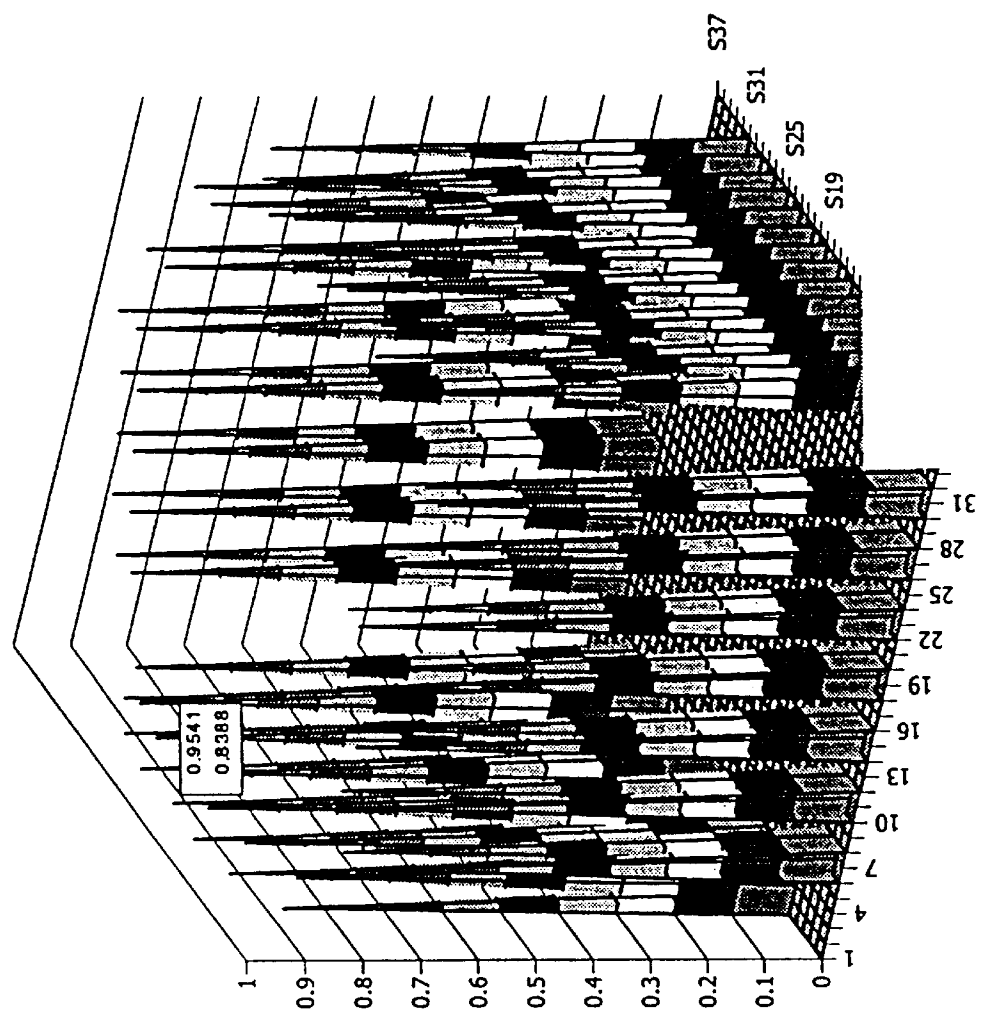
FIG. 20 is a three-dimensional chart illustrating the magnitude of current flow through each of the VSS power pins of the arrangement depicted in FIGS. 14–17, for another set of assumptions for the resistance of the power planes and the resistance of the connector pins.

This same package arrangement was analyzed again assuming a plastic PGA package whose internal power planes are copper and are a factor of 10 less resistive than the tungsten planes of the ceramic package. The resulting current per VSS power pin for a plastic PGA package having 2 milliOhm per square copper power planes is depicted in FIG. 20. For this case, the highest current is approximately 0.95 amps, and the lowest is approximately 0.84 amps. The min-to-max spread is slightly smaller due to the lower resistance of the package power planes, and the better distribution of current flow from the integrated circuit die footprint to each of the VSS package power pins.

Figure 21:
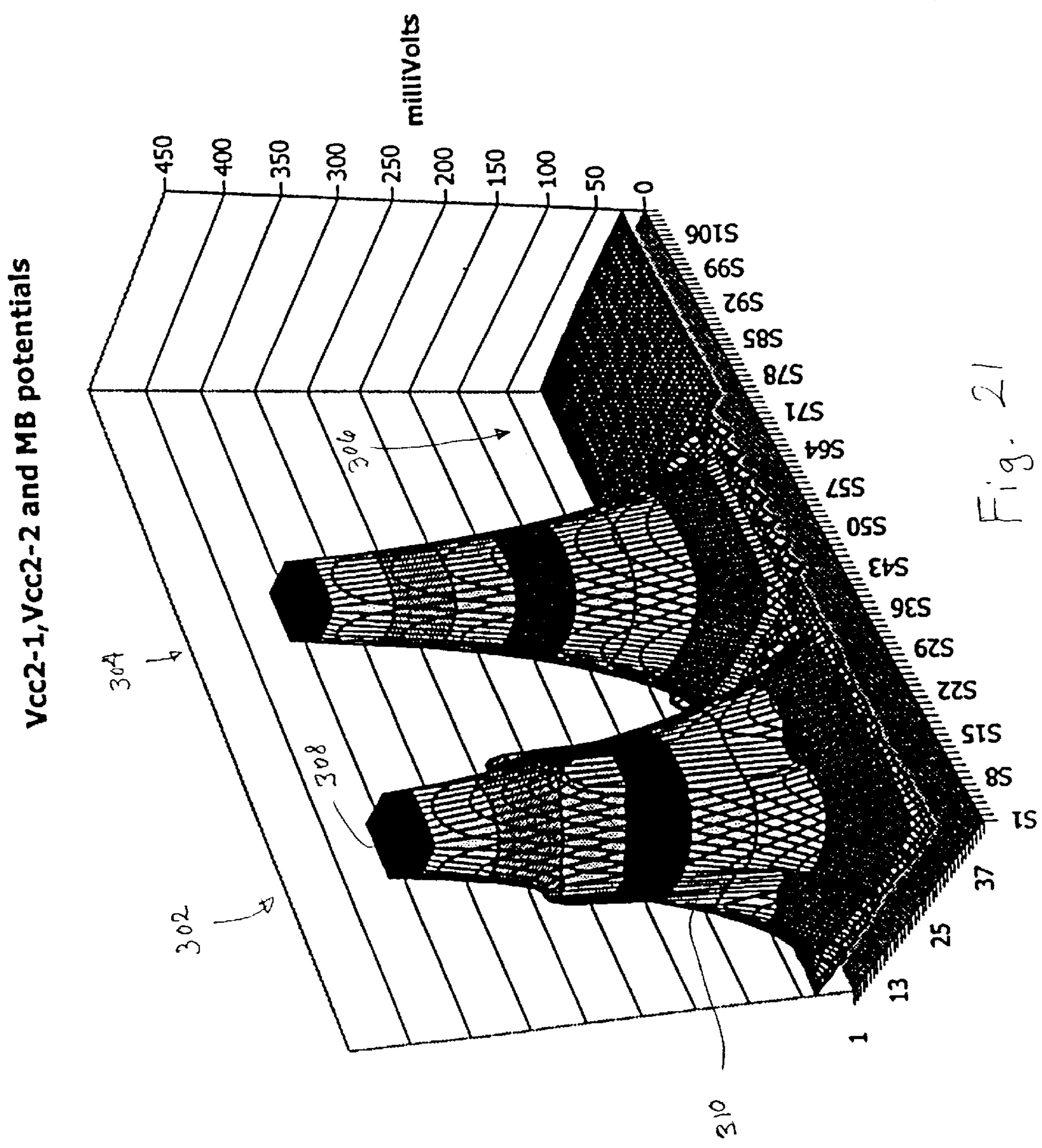
FIG. 21 is a three-dimensional chart illustrating the voltage of each element of the upper power plane, the lower power plane, and the motherboard power plane as depicted in FIGS. 14–17, as calculated for the set of resistance assumptions for the power planes and the connector pins corresponding to the power pin current chart shown in FIG. 19.

The uniformity of current flow per power pin is remarkably better than the earlier package arrangement depicted in FIG. 5. Moreover, as FIGS. 19 and 20 illustrate, such uniformity may be achieved using a common power plane design for different packages having a factor of 10 variation in resistivity of the internal power planes. The total voltage drop between the motherboard and the integrated circuit die footprint varies as a function of the resistivity of the package power planes, but the uniformity of current per power pin basically does not change significantly. For example, FIG. 21 illustrates in a three-dimensional plot the equipotentials for the ceramic PGA package whose current per power pin was shown in FIG. 19. The left-most contour 302 represents the equipotentials for the upper power plane 210. The integrated circuit die footprint 308 has the highest voltage of about 425 mV. The effect of the four slots or voids are clearly seen as causing a vertical wall in the voltage contour, one of which is labeled as 310. The central contour 304 represents the equipotentials for the lower power plane 220. The "ripples" in voltage around the rectangular peripheral ring are visible, with the lowest voltage corresponding to the locations of the various power pins connected to the plane. The sloped walls of contour 304 result from modeling the annular void in the lower power plane 220 as a grid of very high resistances, even though the current flow is insignificant. The right-most contour 306 represents the equipotentials for the motherboard power plane in the region below the package, and shows a voltage of about 25 mV. Consequently, the voltage drop between the die footprint and the motherboard is calculated as about 400 mV. Most of the voltage drop occurs within the package power planes, and very little occurs within the motherboard power plane.

Figure 22:
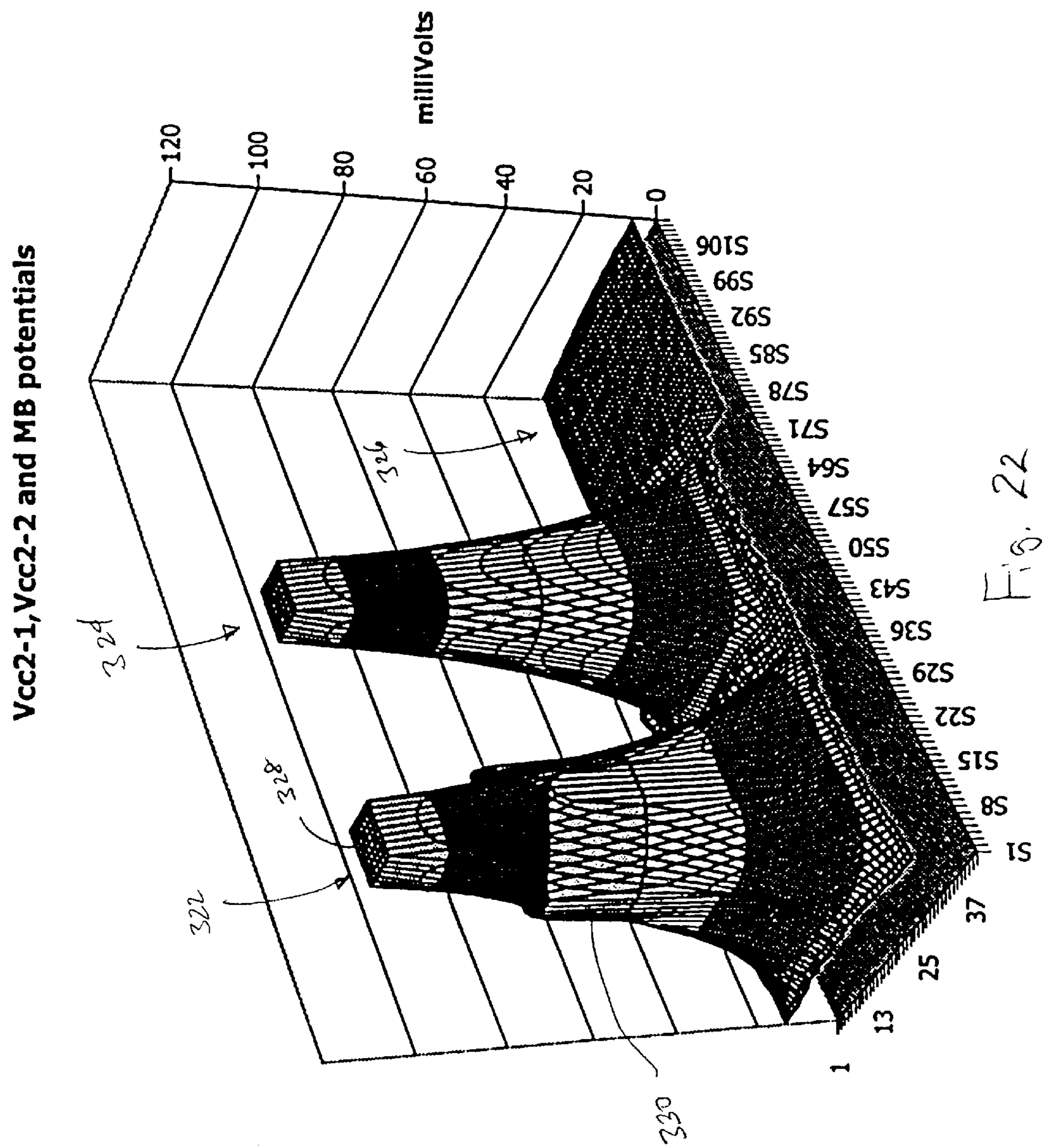
FIG. 22 is a three-dimensional chart illustrating the voltage of each element of the upper power plane, the lower power plane, and the motherboard power plane as depicted in FIGS. 14–17, as calculated for the set of resistance assumptions for the power planes and the connector pins corresponding to the power pin current chart shown in FIG. 20.

The corresponding equipotential plot for the plastic PGA package (whose current per power pin was shown in FIG. 20) is depicted in FIG. 22. The left-most contour 322 represents the equipotentials for the upper power plane 210. The integrated circuit die footprint 328 has the highest voltage of about 110 mV. The effect of the four slots or voids are again seen as causing a vertical wall in the voltage contour, one of which is labeled as 330. The central contour 324 represents the equipotentials for the second power plane. The "ripples" in voltage around the rectangular peripheral ring are again visible, although smaller in magnitude due to the lower resistance of the copper power plane. The right-most contour 326 represents the equipotentials for the motherboard power plane in the region below the package, and shows a voltage of about 10 mV. Consequently, the voltage drop between the die and the motherboard is calculated as about 100 mV. As with the ceramic package, most of the voltage drop occurs within the package power planes, and very little occurs within the motherboard power plane, although the total voltage drop is much less.

As demonstrated by the above examples using a 321-pin PGA package, an average current per power pin of about 0.9 amps may be achieved with a maximum current less than. 1 amp/pin and a minimum current greater than 0.8 amps/pin. Both plastic and ceramic PGA packages with either 321 or 370 pins may be designed to handle a maximum current of 60 amps by using a number of power pins for each supply equal to about 60/0.9, or 66 power pins. In other words, by allocating 66 pins for power (i.e., VDD) and 66 pins for ground (i.e., VSS), either package may be designed to carry a maximum total supply current of 60 amps, while maintaining the current through each such power pin below a critical current level of 1 amp/pin as defined by the pin/socket manufacturer's specification.

Such achievements are made possible by careful design of the power plane, the choice of power pin locations, and the inter-plane via locations to provide for nearly uniform resistance of each conduction path from the die footprint to a respective package pin. Sections of the two power planes in the PGA package were removed in order to divert current flow and to approximately provide the same resistance to every power pin location. The invention is particularly useful for power planes whose nominal resistivity exceeds about 10 milliOhms per square.

The invention thus far has been largely described in the context of an exemplary pin grid array (PGA) package, but the invention is by no means limited to such packages. Many types of integrated circuit carriers are constructed using multiple internal conductive layers, some of which may be arranged as conductive planes, which may benefit from the teachings of this disclosure. For example, lead-less chip carriers are very similar to ceramic or plastic PGA packages, but whose external electrodes do not extend from the package body (as do the package pins for a PGA package), but rather provide a conductive pad to which external contact may be made. Nontheless, the internal construction of many LCCs may be arranged to incorporate power planes, internal vias, and external electrodes in a manner as disclosed herein and benefit from the teachings of this invention. Similarly, other types of integrated circuit carriers, such as ball grid arrays, and others, may similarly benefit.

Consequently, while the invention has been largely described with respect to the embodiments set forth above, the invention is not necessarily limited to these embodiments, which are given by way of example only. Variations and modifications of the embodiments disclosed herein may be made based on the description set forth herein, without departing from the scope and spirit of the invention as set forth in the following claims. Accordingly, other embodiments, variations, and improvements not described herein are not necessarily excluded from the scope of the invention, which is defined by the following appended claims.

What is claimed is:

1. An integrated circuit carrier comprising:

at least a first conductive plane providing electrical interconnection between a plurality of external electrodes and a plurality of internal contact pads, said first plane including at least one void for raising the impedance of a conductive path between at least one external electrode and at least one internal contact pad.

2. A carrier as recited in claim 1 wherein each internal contact pad is arranged to provide an attachment point for a wire bond connection to an integrated circuit.

3. A carrier as recited in claim 1 wherein each internal contact pad is arranged to provide an attachment point for a solder bump connection to an integrated circuit.

4. A carrier as recited in claim 1 wherein the at least one void is only partially surrounded by conductive material forming the first plane.

5. A carrier as recited in claim 1 wherein the at least one void is totally surrounded by conductive material forming the first plane.

6. A carrier as recited in claim 5 wherein the at least one void comprises a slot arranged parallel to an edge of the carrier and perpendicular to the direction of current flow otherwise occurring between said at least one external electrode and said at least one internal contact pad absent said at least one void.

7. A carrier as recited in claim 1 wherein the impedance of a conduction path between the plurality of internal contact pads and a first external electrode having the lowest impedance is closer in magnitude to the impedance of a conduction path between the plurality of internal contact pads and a second external electrode having the highest impedance than without said at least one void.

8. A carrier as recited in claim 7 wherein the variation of the respective impedance of the respective conduction path between a respective external electrode and the plurality of internal contact pads is more uniform than without said at least one void.

9. A carrier as recited in claim 1 wherein:

the carrier comprises a pin grid array package; and the external electrodes comprise package pins of the pin grid array.

10. A carrier as recited in claim 1 further comprising:

a second conductive plane formed in a region of the external electrodes, and coupled to each of the plurality of external electrodes; and a plurality of vias connecting the first conductive plane to the second conductive plane, thereby providing an electrical connection between the first conductive plane and the external electrodes.

11. A integrated circuit assembly comprising:

a carrier as recited in claim 1; and an integrated circuit attached to the carrier.

12. A carrier for an integrated circuit, said carrier comprising:

a body having a surface for attaching thereto an integrated circuit;

a plurality of external electrodes on the body for communicating voltages and signals to and from the integrated circuit;

a plurality of internal contact pads for making an electrical contact to a corresponding pad of the integrated circuit, certain of said internal contact pads being respectively connected to respective ones of the external electrodes;

a first conductive plane within the body and extending generally throughout a region including both the external electrodes and the internal contact pads for coupling a group of the external electrodes to a group of the internal contact pads, wherein the first conductive plane includes at least one void for raising the impedance of a conductive path through the first plane between at least one of the group of internal contact pads and at least one of the group of external electrodes.

13. A carrier as recited in claim 12 wherein:

each internal contact pad is arranged to provide an attachment point for a solder bump connection to an integrated circuit; and the at least one void is totally surrounded by conductive material forming the first plane.

14. A carrier as recited in claim 12 wherein:

the at least one void comprises a slot arranged parallel to an edge of the carrier and perpendicular to the direction of current flow otherwise occurring between said at least one external electrode and said at least one internal contact pad absent said at least one void; and the impedance of a conduction path between the plurality of internal contact pads and a first external electrode having the lowest impedance, as a result of the at least one void in the first plane, is closer in magnitude to the impedance of a conduction path between the plurality of internal contact pads and a second external electrode having the highest impedance than without said at least one void.

15. A carrier as recited in claim 14 wherein the variation of the respective impedance of the respective conduction path between a respective external electrode and the plurality of internal contact pads is more uniform than without said at least one void.

16. A carrier as recited in claim 12 wherein:

the carrier comprises a pin grid array package; and the external electrodes comprise external package pins of the pin grid array.

17. A carrier as recited in claim 16 wherein:

the pin grid array package comprises a ceramic pin grid array package; and the first conductive plane comprises a plane having a resistivity greater than about 10 ohm-centimeters.

18. A carrier as recited in claim 17 wherein:

the first conductive plane comprises a tungsten or molybdenum plane.

19. A carrier as recited in claim 16 wherein:

the pin grid array package comprises a plastic pin grid array package.

20. An integrated circuit assembly comprising:

a carrier including a body having a surface for attaching thereto an integrated circuit;

a plurality of external electrodes on the body for communicating voltages and signals to and from the integrated circuit;

a plurality of internal contact pads for making an electrical contact to a corresponding pad of the integrated circuit, certain of said internal contact pads being respectively connected to respective ones of the external electrodes; and a first conductive plane within the body and extending generally throughout a region including both the external electrodes and the internal contact pads for coupling a group of the external electrodes to a group of the internal contact pads, wherein the first conductive plane includes at least one void for raising the impedance of a conductive path through the first plane between at least one of the group of internal contact pads and at least one of the group of external electrodes; and an integrated circuit attached to the body surface.

21. An assembly as recited in claim 20 wherein:

the carrier comprises a pin grid array; and the internal contact pads are connected to corresponding bonding pads on the integrated circuit using solder bumps.

22. An integrated circuit carrier comprising:

a rigid rectangular body for supporting an integrated circuit when attached thereto;

a plurality of external electrodes extending from a region of the body which forms a rectangular annular ring around the periphery of the body;

a plurality of internal contact pads formed within a central region of the body, certain of said internal contact pads being respectively connected to respective ones of the external electrodes;

a first conductive plane within the body and extending generally between and including the annular ring region and the central region, said first conductive plane providing an interconnection between certain ones of the plurality of internal contact pads and certain ones of the plurality of external electrodes, said first plane including at least one void disposed at a location relative to at least one internal contact pad and at least one external electrode which serves to raise the impedance of a conductive path therebetween.

23. A carrier as recited in claim 22 wherein:

the at least one void is disposed at a location between said at least one internal contact pad and said at least one external electrode.

24. A carrier as recited in claim 23 wherein the first conductive plane includes:

a plurality of voids, each located in a region between the internal contact pads and the external electrodes along a respective horizontal or vertical centerline of the body, each void intersecting the respective centerline perpendicular to the centerline.

25. A carrier as recited in claim 24 further comprising:

a second conductive plane arranged to form a rectangular annular ring around the periphery of the body; and a plurality of vias connecting the first conductive plane to the second conductive plane.

26. A carrier as recited in claim 25 wherein:

the plurality of vias are arranged in groups arranged such that each external electrode is generally located between two adjacent groups of vias.

27. A carrier as recited in claim 26 wherein:

the carrier pins are arranged in at least two rows of carrier pins traversing the perimeter of the enclosure; and each group of vias is located further from the center of the enclosure than the innermost row of carrier pins on each side of the enclosure.

28. A integrated circuit assembly comprising:

a carrier as recited in claim 22; and an integrated circuit attached to the body of the carrier.

29. A method of improving the uniformity in impedance of various conduction paths between internal contact pads and external electrodes of an integrated circuit carrier, said method comprising:

providing an integrated circuit carrier having a rigid body for supporting an integrated circuit when attached thereto, having a plurality of external electrodes on the body for communicating external voltages and signals to and from the integrated circuit, having a plurality of internal contact pads for making an electrical contact to a corresponding pad of the integrated circuit, certain of said internal contact pads being respectively connected to respective ones of the external electrodes, and having at least one conductive plane within the body and extending generally throughout a region including both the external electrodes and the internal contact pads; and providing at least one void in the conductive plane for raising the impedance of a conductive path between at least one contact pad and at least one external electrode nearer to the magnitude of a higher impedance conductive path between another external electrode and an internal contact pad.

30. A method as recited in claim 29 further comprising:

providing a plurality of voids in the conductive plane, each located in a region between the internal contact pads and the external electrodes along a respective horizontal or vertical centerline of the body, each void intersecting the respective centerline perpendicular to the centerline.

31. A method as recited in claim 29 further comprising:

providing a second conductive plane at least along the periphery of the body; and providing a plurality of vias connecting the first conductive plane to the second conductive plane.

32. A method as recited in claim 31 further comprising:

arranging the plurality of vias in groups; and locating each external electrode generally between two adjacent groups of vias.

33. A method as recited in claim 32 further comprising:

arranging the external electrodes in at least two rows of external electrodes traversing the perimeter of the body; and locating each group of vias further from the center of the body than the innermost row of external electrodes on each side of the body.

34. A method as recited in claim 29 wherein the at least one void comprises a slot arranged parallel to an edge of the carrier and perpendicular to the direction of current flow otherwise occurring between said at least one external electrode and said at least one internal contact pad absent said at least one void.

35. A method as recited in claim 29 wherein:

the carrier comprises a pin grid array package; and the external electrodes comprise package pins of the pin grid array.

36. A method as recited in claim 35 wherein:

the pin grid array package comprises a ceramic pin grid array package; and the first conductive plane comprises a plane having a resistivity greater than about 10 ohm-centimeters.

37. A carrier as recited in claim 36 wherein:

the first conductive plane comprises a tungsten or molybdenum plane.

* * * * *